(12) United States Patent
Sun et al.

(10) Patent No.: US 10,325,943 B2
(45) Date of Patent: Jun. 18, 2019

(54) THIN FILM TRANSISTOR, DISPLAY SUBSTRATE AND DISPLAY PANEL HAVING THE SAME, AND FABRICATING METHOD THEREOF

(71) Applicants: BOE TECHNOLOGY GROUP CO., LTD., Beijing (CN); Ordos Yuansheng Optoelectronics Co., Ltd., Ordos (CN)

(72) Inventors: Chaochao Sun, Beijing (CN); Chao Wang, Beijing (CN); Huafeng Liu, Beijing (CN); Shengwei Zhao, Beijing (CN); Bule Shun, Beijing (CN); Lei Yang, Beijing (CN); Chongliang Hu, Beijing (CN); Meng Yang, Beijing (CN); Jingping Lv, Beijing (CN); Lin Xie, Beijing (CN); Shimin Sun, Beijing (CN); Duolong Ding, Beijing (CN)

(73) Assignees: BOE TECHNOLOGY GROUP CO., LTD., Beijing (CN); Ordos Yuansheng Optoelectronics Co., Ltd., Ordos (CN)

( * ) Notice: Subject to any disclaimer, the term of this patent is extended or adjusted under 35 U.S.C. 154(b) by 0 days.

(21) Appl. No.: 15/533,109

(22) PCT Filed: Dec. 12, 2016

(86) PCT No.: PCT/CN2016/109512
§ 371 (c)(1),
(2) Date: Jun. 5, 2017

(87) PCT Pub. No.: WO2017/219621
PCT Pub. Date: Dec. 28, 2017

(65) Prior Publication Data
US 2018/0197901 A1    Jul. 12, 2018

(30) Foreign Application Priority Data

Jun. 23, 2016    (CN) .......................... 2016 1 0465623

(51) Int. Cl.
*H01L 27/12*    (2006.01)
*H01L 29/66*    (2006.01)
(Continued)

(52) U.S. Cl.
CPC ...... *H01L 27/1288* (2013.01); *H01L 21/0262* (2013.01); *H01L 21/0274* (2013.01);
(Continued)

(58) Field of Classification Search
CPC ......... H01L 29/78621; H01L 29/66757; H01L 27/1214; H01L 29/4908; H01L 29/78627
(Continued)

(56) References Cited

U.S. PATENT DOCUMENTS

| 7,592,628 B2 * | 9/2009 | Morimoto | H01L 27/1214 257/72 |
| 2002/0094612 A1 * | 7/2002 | Nakamura | H01L 21/3226 438/149 |

(Continued)

FOREIGN PATENT DOCUMENTS

| CN | 1917155 A | 2/2007 |
| CN | 103021820 A | 4/2013 |

(Continued)

OTHER PUBLICATIONS

International Search Report & Written Opinion dated Mar. 29, 2017, regarding PCT/CN2016/109512.
(Continued)

*Primary Examiner* — Jonathan Han
(74) *Attorney, Agent, or Firm* — Intellectual Valley Law, P.C.

(57) ABSTRACT

The present application discloses a method of fabricating a thin film transistor, including forming a semiconductor layer having a pattern corresponding to that of the active layer on a base substrate; forming a first photoresist layer on a side
(Continued)

of the semiconductor layer distal to the base substrate; the first photoresist layer being in an area corresponding to the channel region, the second doped region, and the fourth doped region; doping a region of the semiconductor layer corresponding to the first doped region and the third doped region using the first photoresist layer as a mask plate; forming a second photoresist layer by removing a portion of the first photoresist layer to expose an initial portion of the semiconductor layer corresponding to at least a portion of the second doped region and at least a portion of the fourth doped region; and doping the initial portion of the semiconductor layer using the second photoresist layer as a mask plate.

20 Claims, 24 Drawing Sheets

(51) Int. Cl.
*H01L 21/265* (2006.01)
*H01L 21/266* (2006.01)
*H01L 21/027* (2006.01)
*H01L 29/786* (2006.01)
*H01L 21/02* (2006.01)
*H01L 29/167* (2006.01)
*H01L 27/32* (2006.01)

(52) U.S. Cl.
CPC .. *H01L 21/02532* (2013.01); *H01L 21/02592* (2013.01); *H01L 21/02675* (2013.01); *H01L 21/266* (2013.01); *H01L 21/26513* (2013.01); *H01L 27/1214* (2013.01); *H01L 27/1222* (2013.01); *H01L 27/1274* (2013.01); *H01L 29/167* (2013.01); *H01L 29/66757* (2013.01); *H01L 29/66765* (2013.01); *H01L 29/78621* (2013.01); *H01L 29/78633* (2013.01); *H01L 29/78645* (2013.01); *H01L 29/78675* (2013.01); *H01L 29/78678* (2013.01); *H01L 27/3262* (2013.01)

(58) Field of Classification Search
USPC ....... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
See application file for complete search history.

(56) References Cited

U.S. PATENT DOCUMENTS

| | | | |
|---|---|---|---|
| 2004/0063270 A1* | 4/2004 | Ishikawa | H01L 27/1214 438/222 |
| 2007/0040174 A1* | 2/2007 | Kim | H01L 27/1214 257/59 |
| 2011/0303923 A1* | 12/2011 | Noh | H01L 29/458 257/72 |
| 2013/0043480 A1* | 2/2013 | Adachi | G03B 27/00 257/71 |
| 2013/0071963 A1* | 3/2013 | Choi | H01L 29/78627 438/34 |
| 2016/0181289 A1 | 6/2016 | Long et al. | |
| 2016/0343829 A1 | 11/2016 | Chen et al. | |

FOREIGN PATENT DOCUMENTS

| | | |
|---|---|---|
| CN | 104733323 A | 6/2015 |
| KR | 20080056581 A | 6/2008 |
| WO | 2015180320 A1 | 12/2015 |

OTHER PUBLICATIONS

First Office Action in the Chinese Patent Application No. 201610465623.5, dated Oct. 19, 2017; English translation attached.
First Office Action in the Korean Patent Application No. 20177015877, dated Jan. 24, 2019; English translation attached.

* cited by examiner

THIN FILM TRANSISTOR, DISPLAY SUBSTRATE AND DISPLAY PANEL HAVING THE SAME, AND FABRICATING METHOD THEREOF

CROSS-REFERENCE TO RELATED APPLICATION

This application is a national stage application under 35 U.S.C. § 371 of International Application No. PCT/CN2016/109512 filed Dec. 12, 2016, which claims priority to Chinese Patent Application No. 201610465623.5, filed Jun. 23, 2016, the contents of which are incorporated by reference in the entirety.

TECHNICAL FIELD

The present invention relates to display technology, more particularly, to a thin film transistor, a display substrate and a display panel having the same, and a fabricating method thereof.

BACKGROUND

Low temperature polycrystalline silicon thin film transistors have been widely used in various display apparatuses such as mobile phones, tablets, and watches. A thin film transistor having a high mobility rate may be manufactured by doping the polycrystalline silicon layer. Because polycrystalline silicon has a relatively low resistance, increasing the mobility rate of a thin film transistor often results in a high leakage current, severely affecting electrical properties of the thin film transistor. To decrease leakage current in the thin film transistor, the polycrystalline silicon layer may be made to include a heavy doping region and a light doping region.

SUMMARY

In one aspect, the present invention provides method of fabricating a thin film transistor comprising an active layer having a channel region, a source contact region, and a drain contact region, wherein the source contact region comprises a first doped region and a second doped region between the first doped region and the channel region, the drain contact region comprises a third doped region and a fourth doped region between the third doped region and the channel region, the first doped region has a higher dopant concentration than that of the second doped region, and the third doped region has a higher dopant concentration that that of the fourth doped region; the method comprising forming a semiconductor layer having a pattern corresponding to that of the active layer on a base substrate; forming a first photoresist layer on a side of the semiconductor layer distal to the base substrate; the first photoresist layer being in an area corresponding to the channel region, the second doped region, and the fourth doped region; doping a region of the semiconductor layer corresponding to the first doped region and the third doped region using the first photoresist layer as a mask plate; forming a second photoresist layer by removing a portion of the first photoresist layer to expose an initial portion of the semiconductor layer corresponding to at least a portion of the second doped region and at least a portion of the fourth doped region; and doping the initial portion of the semiconductor layer using the second photoresist layer as a mask plate.

Optionally, doping the initial portion of the semiconductor layer is limited to only the second doped region and the fourth doped region, or portions thereof; subsequent to doping the initial portion of the semiconductor layer, the region of the semiconductor layer corresponding to the first doped region and the third doped region has a higher dopant concentration than that of the initial portion of the semiconductor layer.

Optionally, subsequent to doping the initial portion of the semiconductor layer, further comprising performing following steps at least once: removing a portion of the second photoresist layer to expose an additional portion of the semiconductor layer corresponding to an additional portion of the second doped region and an additional portion of the fourth doped region; and doping the additional portion of the semiconductor layer using a remaining second photoresist layer as a mask plate; wherein the additional portion of the second doped region is between the portion of the second doped region and the channel region, the additional portion of the fourth doped region is between the portion of the fourth doped region and the channel region; and the initial portion of the semiconductor layer has a higher dopant concentration than that of the additional portion of the semiconductor layer.

Optionally, doping the initial portion of the semiconductor layer is performed by doping in a same process the region of the semiconductor layer corresponding to the first doped region and the third doped region, and the initial portion of the semiconductor layer; and the region of the semiconductor layer corresponding to the first doped region and the third doped region has a higher dopant concentration than that of the initial portion of the semiconductor layer.

Optionally, subsequent to doping the initial portion of the semiconductor layer, further comprising performing following steps at least once: removing a portion of the second photoresist layer to expose an additional portion of the semiconductor layer corresponding to an additional portion of the second doped region and an additional portion of the fourth doped region; and doping in a same process the region of the semiconductor layer corresponding to the first doped region and the third doped region, the initial portion of the semiconductor layer, and any additional portion of the semiconductor layer; wherein the additional portion of the second doped region is between the portion of the second doped region and the channel region, the additional portion of the fourth doped region is between the portion of the fourth doped region and the channel region; the initial portion of the semiconductor layer has a higher dopant concentration than that of the additional portion of the semiconductor layer, a dopant concentration in the source contact region decreases along a direction from the first doped region to the channel region; and a dopant concentration in the drain contact region decreases along a direction from the third doped region to the channel region.

Optionally, forming the semiconductor layer comprises forming a semiconductor material layer on the base substrate; forming a photoresist material layer on a side of the semiconductor material layer distal to the base substrate; exposing the photoresist material layer with a mask plate, and developing an exposed photoresist material layer to obtain a photoresist pattern having a first section corresponding to the active layer, a second section outside of the first region, the photoresist material being removed in the second section thereby forming a third photoresist layer in the first section; and removing the semiconductor material layer in the second section thereby forming the semiconductor layer.

Optionally, the mask plate is a half-tone mask plate or a gray-tone mask plate, the first section comprises a first zone and a second zone; the first zone corresponding to the channel region, the second doped region, and the fourth doped region; the second zone corresponding to the first doped region and the third doped region; the first zone is substantially unexposed, the second zone is partially exposed, and the second section is fully exposed; the third photoresist layer in the first zone has a thickness greater than that in the second zone.

Optionally, forming the first photoresist layer comprises ashing the third photoresist layer to remove the third photoresist layer in the second zone thereby exposing the region of the semiconductor layer corresponding to the first doped region and the third doped region; wherein photoresist material in the first zone remains with a reduced thickness subsequent to ashing, thereby forming the first photoresist layer.

Optionally, subsequent to forming the semiconductor material layer and prior to forming the photoresist material layer, further comprising doping the semiconductor material layer, wherein the channel region is doped with a dopant subsequent to doping the semiconductor material layer.

Optionally, removing the portion of the first photoresist layer is performed by ashing.

Optionally, removing the portion of the second photoresist layer is performed by ashing.

Optionally, the dopant is one of phosphor and boron.

Optionally, the thin film transistor is a bottom gate-type thin film transistor, prior to forming the semiconductor layer, the method further comprising forming a gate electrode layer on the base substrate; and forming a first buffer layer on a side of the gate electrode layer distal to the base substrate; wherein the first buffer layer is formed between the gate electrode layer and the semiconductor layer.

Optionally, the thin film transistor is a top gate-type thin film transistor, prior to forming the semiconductor layer, the method further comprising forming a light shielding layer on the base substrate; and forming a second buffer layer on a side of the gate electrode layer distal to the base substrate; wherein the second buffer layer is formed between the light shielding layer and the semiconductor layer.

In another aspect, the present invention provides a thin film transistor fabricated by a method described herein.

In another aspect, the present invention provides a display substrate comprising a thin film transistor described herein or fabricated by a method described herein.

In another aspect, the present invention provides a display panel comprising a display substrate described herein.

In another aspect, the present invention provides a display apparatus comprising a display panel described herein.

In another aspect, the present invention provides a thin film transistor, comprising an active layer having a channel region, a source contact region, and a drain contact region; wherein the source contact region comprises a first doped region and a second doped region between the first doped region and the channel region, the drain contact region comprises a third doped region and a fourth doped region between the third doped region and the channel region, the first doped region has a higher dopant concentration than that of the second doped region, and the third doped region has a higher dopant concentration that that of the fourth doped region; the second doped region comprises a plurality of second doped sub-regions, a dopant concentration in the plurality of second doped sub-regions decreases along a direction from the first doped region to the channel region; and the fourth doped region comprises a plurality of fourth doped sub-regions, a dopant concentration in the plurality of fourth doped sub-regions decreases along a direction from the third doped region to the channel region.

Optionally, the source contact region further comprises an un-doped source contact sub-region between the channel region and the second doped region; and the drain contact region further comprises an un-doped drain contact region between the channel region and the fourth doped region.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
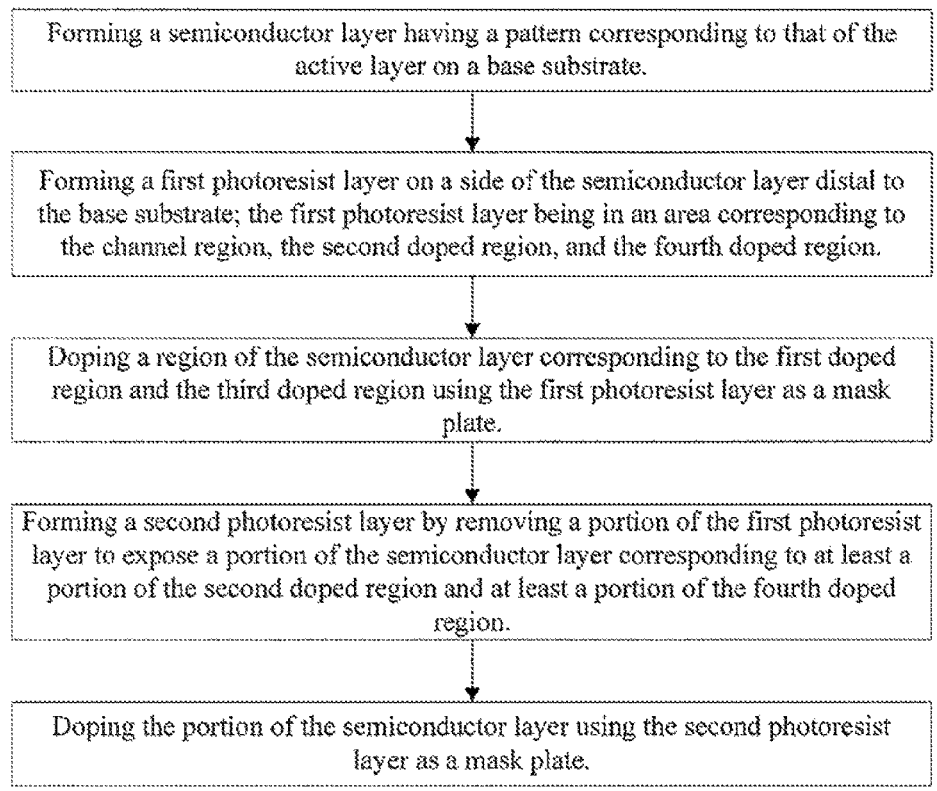
FIG. 1 is a flow chart illustrating a method of fabricating a thin film transistor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional method of fabricating a low temperature polycrystalline silicon thin film transistor, the gate electrode may be used as a mask plate for doping the polycrystalline silicon layer. For example, the gate electrode may be etched several times for a step-wise doping of the polycrystalline silicon layer. Typically, a polycrystalline silicon layer is formed by annealing an amorphous silicon layer at a temperature not higher than 600 Celsius degrees. During the doping process of the active layer (other than a doping process for the channel region), the dopants have to permeate through a gate insulating layer on top of the polycrystalline silicon layer, resulting in waste of dopants and a high degree of energy consumption. Moreover, the gate insulating layer has to be made relatively thin for the dopants to permeate through. However, affected by the deposition condition and the doping process, a thin gate insulating layer is prone to bright spot defects. Also, the conventional method is limited to fabrication of a top gate-type thin film transistor.

Accordingly, the present invention provides, inter alia, a thin film transistor, a display substrate and a display panel having the same, and a fabricating method thereof that substantially obviate one or more of the problems due to limitations and disadvantages of the related art. In one aspect, the present disclosure provides a method of fabricating a thin film transistor including an active layer having a channel region, a source contact region, and a drain contact region, wherein the source contact region includes a first doped region and a second doped region between the first doped region and the channel region, the drain contact region includes a third doped region and a fourth doped region between the third doped region and the channel region, the first doped region has a higher dopant concentration than that of the second doped region, and the third doped region has a higher dopant concentration that of the fourth doped region. In some embodiments, the method includes forming a semiconductor layer having a pattern corresponding to that of the active layer on a base substrate; forming a first photoresist layer on a side of the semiconductor layer distal to the base substrate; the first photoresist layer being in an area corresponding to the channel region, the second doped region, and the fourth doped region; doping a region of the semiconductor layer corresponding to the first doped region and the third doped region using the first photoresist layer as a mask plate; forming a second photoresist layer by removing a portion of the first photoresist layer to expose a portion of the semiconductor layer corresponding to at least a portion of the second doped region and at least a portion of the fourth doped region; and doping the portion of the semiconductor layer using the second photoresist layer as a mask plate.

Several unique advantages may be achieved in the present method. The present method utilizes the photoresist layer as a mask plate for doping the semiconductor layer, one or more heavy doping region and one or more light doping region in the semiconductor layer may be realized by step-wise partial removal of the photoresist layer followed by doping newly exposed semiconductor layer regions. The fabricating process requires forming a photoresist material layer only once, leading to a simplified fabrication process, a shortened fabrication time, and lower manufacturing costs. A highly accurate doping in the semiconductor layer can thus be achieved by performing a step-wise doping in the semiconductor layer using the ashed photoresist layer as a mask plate. The ranges of the heavy doping region and the light doping region can be controlled with a high degree of precision, resulting in a highly uniform product. The present method obviates the need of using the gate insulating layer as the mask plate for doping, avoiding waste of dopant materials and greatly enhancing doping efficiency. Also, the method can be conveniently implemented for fabricating both a top gate-type thin film transistor and a bottom gate-type thin film transistor, making it suitable for various applications. Moreover, the present method obviates the issue of bright spot defects in the gate insulating layer observed in the conventional display panel.

FIG. 1 is a flow chart illustrating a method of fabricating a thin film transistor in some embodiments according to the present disclosure. The thin film transistor fabricated by the present method includes a gate electrode, a gate insulating layer, an active layer, a source electrode, and a drain electrode. The active layer has a channel region, a source contact region, and a drain contact region. The source contact region includes a first doped region, and a second doped region between the first doped region and the channel region. The drain contact region includes a third doped region, and a fourth doped region between the third doped region and the channel region. According to the present method, the first doped region is fabricated to have a higher dopant concentration than that of the second doped region, and the third doped region is fabricated to have a higher dopant concentration that of the fourth doped region.

Referring to FIG. 1, the method in some embodiments includes forming a semiconductor layer having a pattern corresponding to that of the active layer on a base substrate; forming a first photoresist layer on a side of the semiconductor layer distal to the base substrate; the first photoresist layer being in an area corresponding to the channel region, the second doped region, and the fourth doped region; doping a region of the semiconductor layer corresponding to the first doped region and the third doped region using the first photoresist layer as a mask plate; forming a second photoresist layer by removing a portion of the first photoresist layer to expose a portion of the semiconductor layer corresponding to at least a portion of the second doped region and at least a portion of the fourth doped region; and doping the portion of the semiconductor layer using the second photoresist layer as a mask plate. Optionally, removing the portion of the first photoresist layer is performed by ashing. Optionally, the dopant is one of phosphor and boron.

In some embodiments, the dopant is a P-type dopant such as a Group IIIA element of the Periodic Table of the Elements including boron (B), aluminum (Al), gallium (Ga), indium (In), and thallium (TI). In some embodiments, the dopant is an N-type dopant such as a Group VA element of the Periodic Table of the Elements including nitrogen (N), phosphorous (P), arsenic (As), antimony (Sb), and bismuth (Bi). Optionally, the dopant is phosphor. Optionally, the dopant is boron.

Figure 2A:
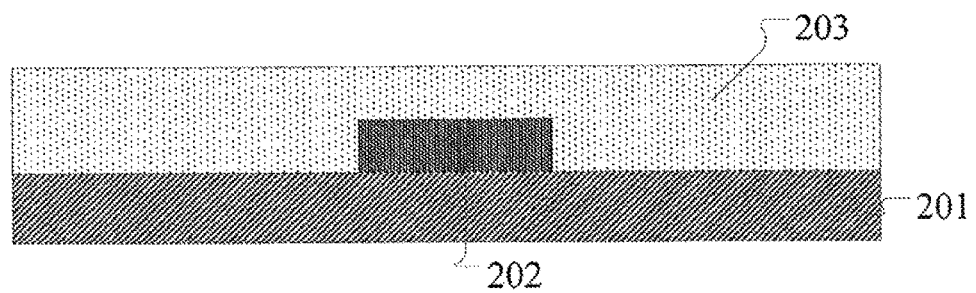
FIGS. 2A-2J illustrate a process of fabricating a bottom gate-type thin film transistor in some embodiments according to the present disclosure.

FIGS. 2A-2J illustrate a process of fabricating a bottom gate-type thin film transistor in some embodiments according to the present disclosure. Referring to FIG. 2A, the process in some embodiments includes forming a gate electrode layer 202 on the base substrate; and forming a first buffer layer 203 on a side of the gate electrode layer 202 distal to the base substrate 201. Various appropriate materials may be used for making the base substrate. Examples of materials suitable for making the base substrate include, but are not limited to, glass, quartz, polyimide, and polyester, etc.

Various appropriate electrode materials and various appropriate fabricating methods may be used to make the gate electrode. For example, an electrode material may be deposited on the substrate by vapor deposition (e.g., plasma-enhanced chemical vapor deposition), magnetron sputtering, or vacuum deposition. Examples of appropriate electrode materials for making the gate electrode include, but are not limited to, titanium, tantalum, aluminum, copper, molybdenum, chromium, and various alloys or laminates thereof. Optionally, the gate electrode has a single-layer structure. Optionally, the gate electrode has a stacked-layer structure including two or more sub-layers. In one example, the process includes forming a gate electrode material layer on the base substrate, forming a photoresist material layer on a side of the gate electrode material layer distal to the base substrate, exposing the photoresist material layer with a mask plate, and developing an exposed photoresist material layer to obtain a photoresist pattern corresponding to the gate electrode layer thereby forming a photoresist layer, and removing the gate electrode material layer in an area outside of the photoresist layer thereby forming the gate electrode layer.

Various appropriate insulating materials and various appropriate fabricating methods may be used to make the first buffer layer. For example, an insulating material may be deposited on the substrate by a plasma-enhanced chemical vapor deposition (PECVD) process and patterned. Examples of appropriate insulating materials for making the first buffer layer include, but are not limited to, silicon oxide ($SiO_x$), silicon nitride ($SiN_y$, e.g., $Si_3N_4$), silicon oxynitride ($SiO_xN_y$). The first buffer layer functions as a gate insulating layer insulating the gate electrode from the active layer.

Figure 2B:
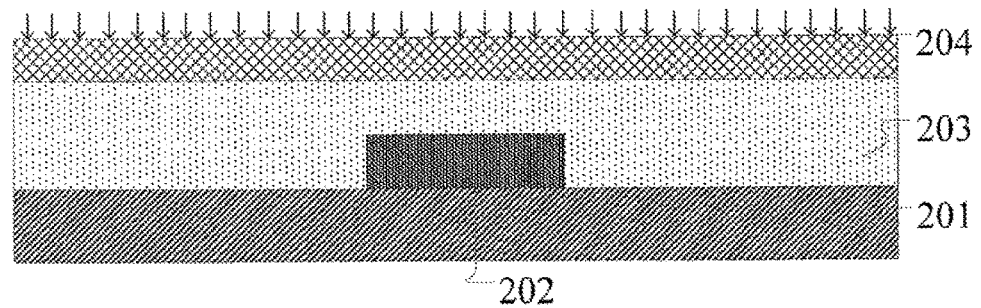

Referring to FIG. 2B, the process in some embodiments further includes forming a semiconductor material layer 204 on a side of the first buffer layer 203 distal to the base substrate 201; and doping the semiconductor material layer 204 with a dopant. By having this step, an active layer formed by the present method includes a doped channel region. By selecting an appropriate dopant and a doping concentration, the threshold voltage of the thin film transistor can be adjusted. Optionally, the doping is performed by a doping implantation process using an N-type dopant, e.g., phosphor. Optionally, the doping is performed by a doping implantation process using a P-type dopant, e.g., boron.

In some embodiments, the process includes forming an amorphous silicon layer on a side of the first buffer layer 203 distal to the base substrate 201 by a plasma-enhanced chemical vapor deposition (PECVD) process, annealing the amorphous silicon layer to form a polycrystalline silicon layer by a laser annealing process, e.g., an excimer laser annealing (ELA) process.

Figure 2C:
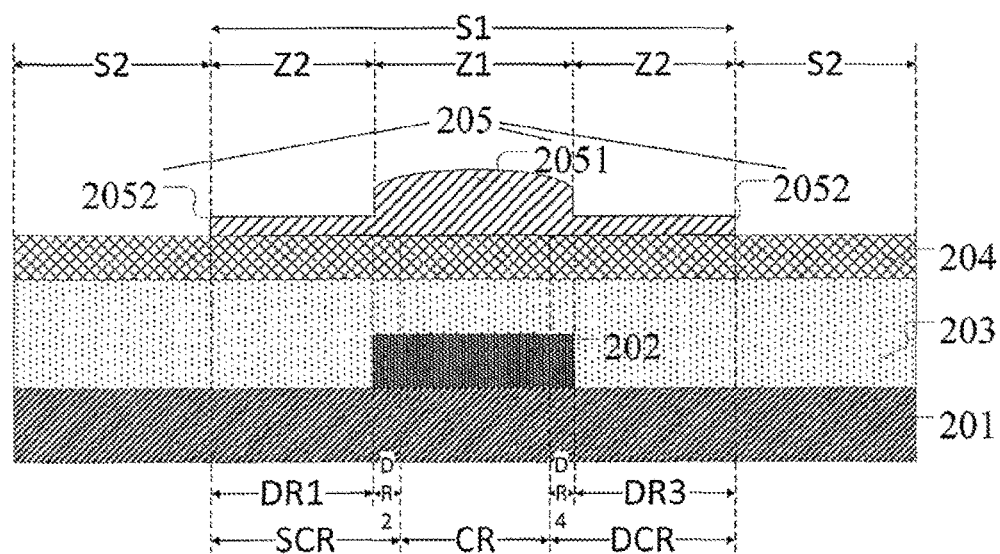

In some embodiments, the process in some embodiments further includes forming a photoresist material layer on a side of the semiconductor material layer distal to the base substrate, and patterning the photoresist material layer to form a third photoresist layer having a pattern corresponding to the active layer. Referring to FIG. 2C, the third photoresist layer 205 includes two portions having different thicknesses, including a first portion 2051 and a second portion 2052, the second portion 2052 having a thickness smaller than the first portion 2051. The second portion 2052 is on two sides of the first portion 2051. Optionally, the first portion 2051 has a substantially uniform thickness. Optionally, the second portion 2052 has a substantially uniform thickness.

Figure 2D:
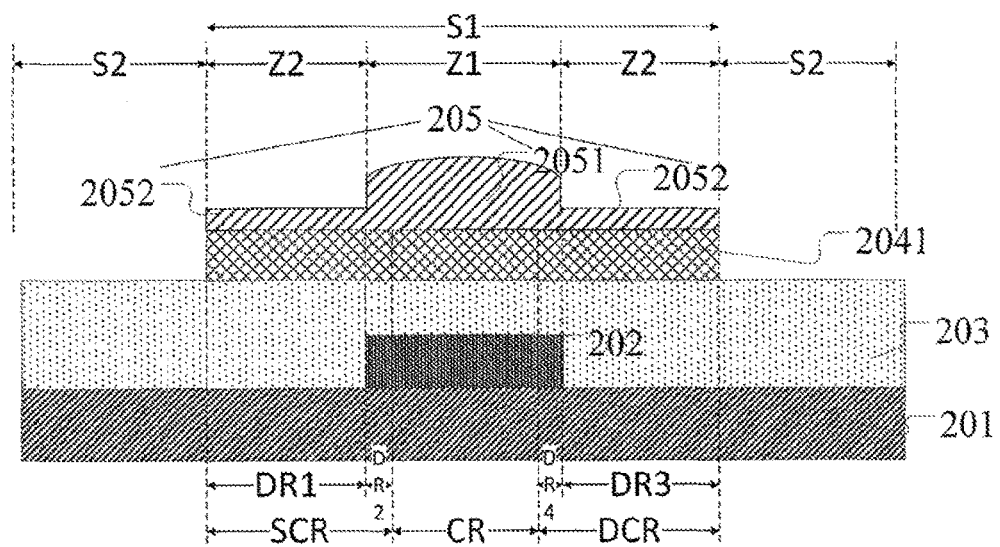

Specifically, the process includes forming a semiconductor material layer 204 on the base substrate 201; forming a photoresist material layer on a side of the semiconductor material layer 204 distal to the base substrate 201; exposing the photoresist material layer with a mask plate, and developing an exposed photoresist material layer to obtain a photoresist pattern having a first section S1 corresponding to the active layer, a second section S2 outside of the first region S1. As shown in FIG. 2C, the photoresist material is removed in the second section S2 thereby forming a third photoresist layer 205 in the first section S1. Referring to FIG. 2D, the semiconductor material layer in the second section S2 is then removed to form a semiconductor layer 2041 in the first section S1.

Optionally, the mask plate is a half-tone mask plate or a gray-tone mask plate. The first section S1 includes a first zone Z1 and a second zone Z2. During the exposure, the first zone Z1 is substantially unexposed, the second zone Z2 is partially exposed, and the second section S2 is fully exposed. As shown in FIG. 2C, the first zone Z1 corresponds to the channel region CR, the second doped region DR2, and the fourth doped region DR4. The second zone Z2 corresponds to the first doped region DR1 and the third doped region DR3. The third photoresist layer 205 in the first zone Z1 is formed to have a thickness greater than that in the second zone Z2.

Figure 2E:
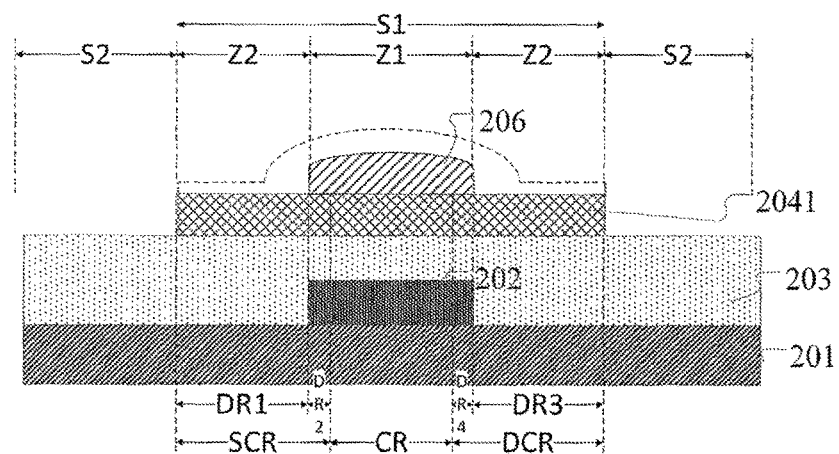

Referring to FIG. 2E, the process in some embodiments further includes forming a first photoresist layer 206. For example, the first photoresist layer 206 may be formed by reducing a thickness and a width of the third photoresist layer. In some embodiments, the step of forming the first photoresist layer 206 includes removing (e.g., by ashing) the second portion of the third photoresist layer (e.g., 2052 in FIG. 2D) (i.e., removing the third photoresist layer in the second zone Z2), thereby exposing a region of the semiconductor layer corresponding to the first doped region DR and the third doped region DR3. Photoresist material in the first zone Z1 remains with a reduced thickness subsequent to ashing, thereby forming the first photoresist layer 206. Optionally, the first photoresist layer 206 has a substantially uniform thickness.

Figure 2F:
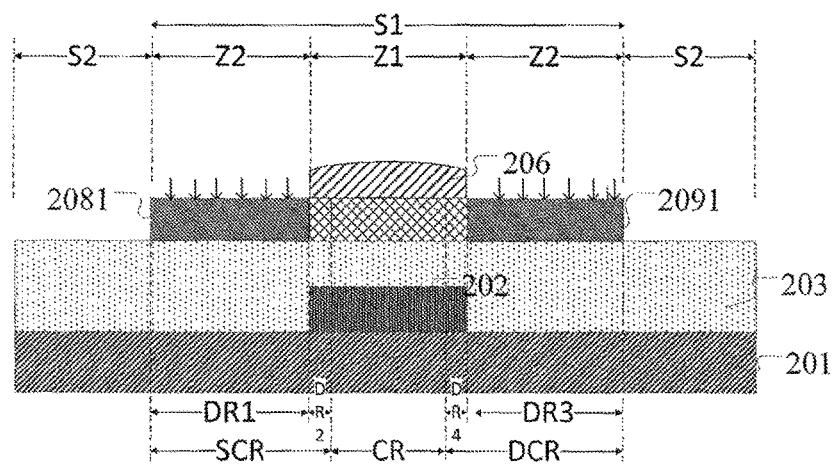

Referring to FIG. 2F, the process in some embodiments further includes doping a region of the semiconductor layer corresponding to the first doped region DR1 and the third doped region DR3 (e.g., the second zone Z2) using the first photoresist layer 206 as a mask plate. Optionally, the doping is performed by a doping implantation process using an N-type dopant, e.g., phosphor. Optionally, the doping is performed by a doping implantation process using a P-type dopant, e.g., boron. Optionally, the doping is performed using a heavy doping implantation process. Subsequent to the doping step, the semiconductor layer includes a heavy doped source contact region 2081 corresponding to the first doped region DR1 in the active layer, and a heavy doped drain contact region 2091 corresponding to the third doped region DR3 in the active layer.

Figure 2G:
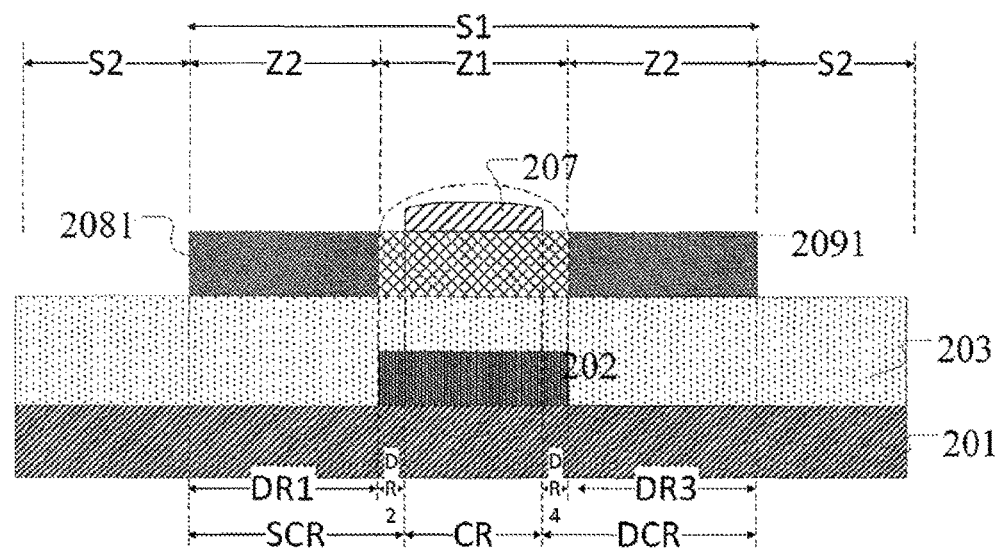

Referring to FIG. 2G, the process in some embodiments further includes forming a second photoresist layer 207. For example, the second photoresist layer 207 may be formed by reducing a thickness and a width of the first photoresist layer. In some embodiments, the step of forming the second photoresist layer 207 includes removing a portion of the first photoresist layer to expose a portion of the semiconductor layer corresponding to at least a portion of the second doped region DR2 and at least a portion of the fourth doped region DR4. Optionally, the second photoresist layer 207 has a substantially uniform thickness.

Figure 2H:
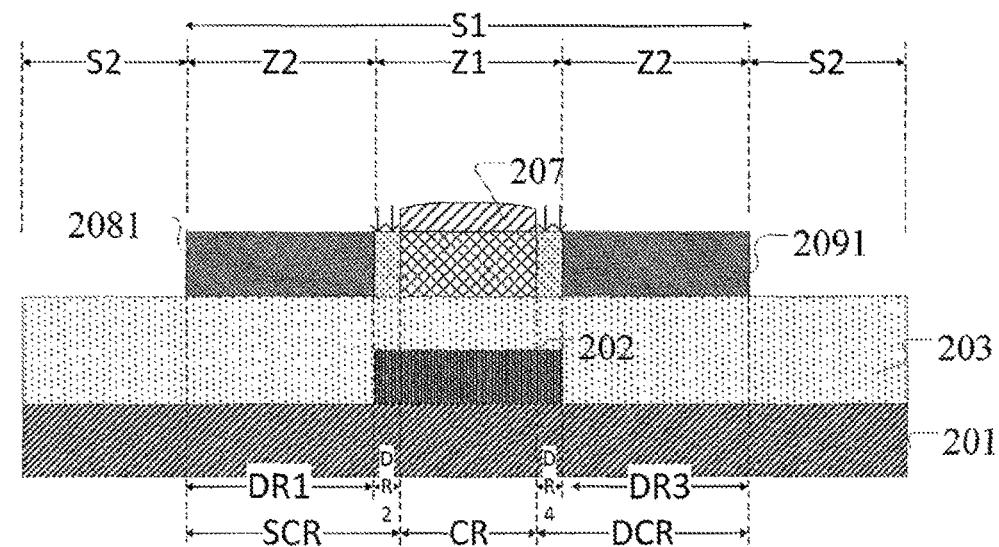

Referring to FIG. 2H, the process in some embodiments further includes doping the portion of the semiconductor layer exposed in the step of forming the second photoresist layer 207 (e.g., at least a portion of the second doped region DR2 and at least a portion of the fourth doped region DR4), using the second photoresist layer 207 as a mask plate. Optionally, the doping is performed by a doping implantation process using an N-type dopant, e.g., phosphor. Optionally, the doping is performed by a doping implantation process using a P-type dopant, e.g., boron. Optionally, the doping is performed using a light doping implantation process. Subsequent to the doping step, the semiconductor layer includes a light doped source contact region 2082 corresponding to the second doped region DR2 in the active layer, and a light doped drain contact region 2092 corresponding to the fourth doped region DR4 in the active layer (see FIG. 2I).

In some embodiments, the second doped region includes a plurality of second doped sub-regions, a dopant concentration in the plurality of second doped sub-regions decreases along a direction from the first doped region to the channel region; the fourth doped region includes a plurality of fourth doped sub-regions, a dopant concentration in the plurality of fourth doped sub-regions decreases along a direction from the third doped region to the channel region. This design can be made possible by removing a portion of the second photoresist layer a plurality of times, and performed a doping process each time a portion of the second photoresist layer is removed using the remaining second photoresist as a mask plate.

In some embodiments, the process in some embodiments includes forming a second photoresist layer by removing a portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is limited to the first portion of the semiconductor layer only. Optionally, the step of doping the first portion of the semiconductor layer is a light doping implantation process. Subsequent to doping the first portion of the semiconductor layer, the region of the semiconductor layer corresponding to the first doped region and the third doped region has a higher dopant concentration than that of the first portion of the semiconductor layer.

In some embodiments, subsequent to doping the first portion of the semiconductor layer, the process in some embodiments further includes performing the following steps at least once: removing a portion of the second photoresist layer to expose a second portion of the semiconductor layer corresponding to an additional portion of the second doped region and an additional portion of the fourth doped region; and doping the second portion of the semiconductor layer using the remaining second photoresist layer as a mask plate. The additional portion of the second doped region is between the channel region and the portion of the second doped region exposed when a portion of the first photoresist layer is removed, the additional portion of the fourth doped region is between the channel region and the portion of the fourth doped region exposed when a portion of the first photoresist layer is removed. The first portion of the semiconductor layer has a higher dopant concentration than that of the second portion of the semiconductor layer. By having this iterative doping process, the second doped region can be made to include a plurality of second doped sub-regions and the fourth doped region can be made to include a plurality of fourth doped sub-regions.

Figure 2I:
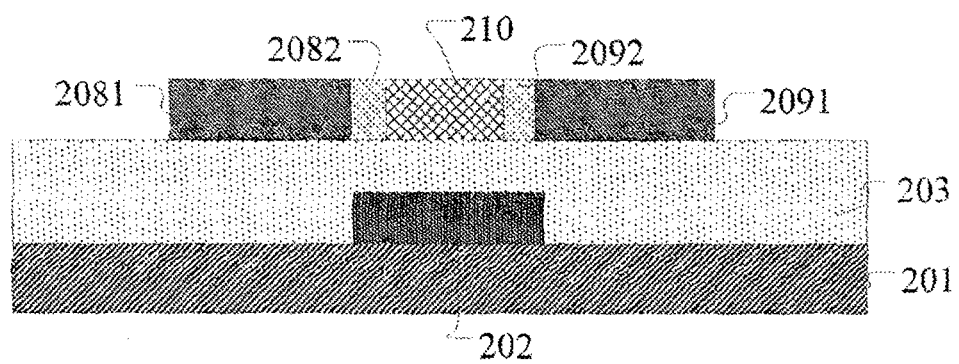
Figure 2J:
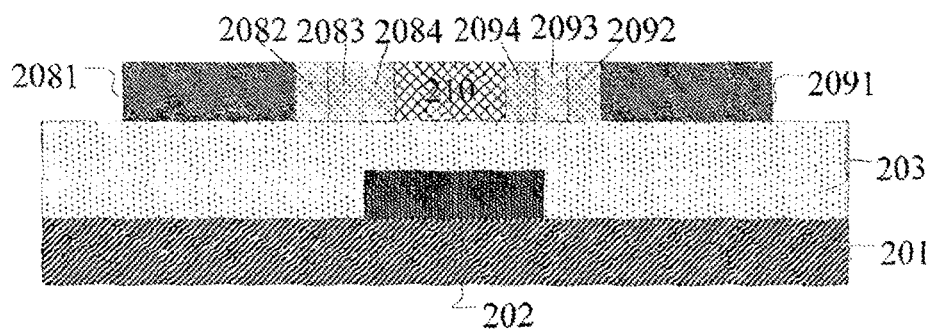

Referring to FIG. 2J, the process in some embodiments include repeating the steps of removing a portion of the second photoresist layer and doping newly exposed portion of the semiconductor layer twice. As a result, the second doped region includes three second doped sub-regions, i.e., 2082, 2083, and 2084, the fourth doped region include three fourth doped sub-regions, i.e., 2092, 2093, and 2094. The second doped sub-region 2082 and the fourth doped sub-region 2092 are formed when the removing and doping processes are performed the first time. The second doped sub-region 2083 and the fourth doped sub-region 2093 are formed when the removing and doping processes are repeated. The second doped sub-region 2084 and the fourth doped sub-region 2094 are formed when the removing and doping processes are repeated the second time. The second doped sub-region 2082 has a higher dopant concentration than that of the second doped sub-region 2083, which in turn has a higher dopant concentration than that of the second doped sub-region 2084. The fourth doped sub-region 2092 has a higher dopant concentration than that of the fourth doped sub-region 2093, which in turn has a higher dopant concentration than that of the fourth doped sub-region 2094. The first doped region 2081 has a higher dopant concentration than that of the second doped sub-regions 2082, 2083, and 2084. The third doped region 2091 has a higher dopant concentration than that of the fourth doped sub-regions 2092, 2093, and 2094. Optionally, the second doped sub-region 2084 is un-doped. Optionally, the fourth doped sub-region 2094 is un-doped.

In some embodiments, the process in some embodiments includes forming a second photoresist layer by removing a first portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is performed by doping, in a same process, the region of the semiconductor layer corresponding to the first doped region and the third doped region, and the first portion of the semiconductor layer. Optionally, the doping process is a heavy doping implantation process. Subsequent to the doping process, the region of the semiconductor layer corresponding to the first doped region and the third doped region has a higher dopant concentration than that of the first portion of the semiconductor layer, because the region of the semiconductor layer corresponding to the first doped region and the third doped region have been doped twice whereas the first portion of the semiconductor layer has only been doped once so far.

In some embodiments, subsequent to doping the first portion of the semiconductor layer, the process in some embodiments further includes performing following steps at least once: removing a portion of the second photoresist layer to expose a second portion of the semiconductor layer corresponding to an additional portion of the second doped region and an additional portion of the fourth doped region; and doping, in a same process, the region of the semiconductor layer corresponding to the first doped region and the third doped region, the first portion of the semiconductor layer, and the second portion of the semiconductor layer. The additional portion of the second doped region is between the channel region and the portion of the second doped region exposed when a portion of the first photoresist layer is removed, the additional portion of the fourth doped region is between the channel region and the portion of the fourth doped region exposed when a portion of the first photoresist layer is removed. The first portion of the semiconductor layer has a higher dopant concentration than that of the second portion of the semiconductor layer. A dopant concentration in the source contact region decreases along a direction from the first doped region to the channel region. A dopant concentration in the drain contact region decreases along a direction from the third doped region to the channel region.

Referring to FIG. 2J, the process in some embodiments include repeating the steps of removing a portion of the second photoresist layer and doping all exposed portions of the semiconductor layer twice. As a result, the second doped region includes three second doped sub-regions, i.e., 2082, 2083, and 2084, the fourth doped region include three fourth doped sub-regions, i.e., 2092, 2093, and 2094. The second doped sub-region 2082 and the fourth doped sub-region 2092 are formed when the removing and doping processes are performed the first time. The second doped sub-region 2083 and the fourth doped sub-region 2093 are formed when the removing and doping processes are repeated. The second doped sub-region 2084 and the fourth doped sub-region 2094 are formed when the removing and doping processes are repeated the second time. The second doped sub-region 2082 has a higher dopant concentration than that of the second doped sub-region 2083, which in turn has a higher dopant concentration than that of the second doped sub-region 2084. The fourth doped sub-region 2092 has a higher dopant concentration than that of the fourth doped sub-region 2093, which in turn has a higher dopant concentration than that of the fourth doped sub-region 2094. The first doped region 2081 has a higher dopant concentration than that of the second doped sub-regions 2082, 2083, and 2084. The third doped region 2091 has a higher dopant concentration than that of the fourth doped sub-regions 2092, 2093, and 2094.

Optionally, the step of removing the portion of the first photoresist layer and the step of removing the portion of the second photoresist layer are performed by ashing. The ashing process can be accurately controlled. In some example, the thickness of the photoresist is measured, the degree of ashing can be accurately controlled by controlling the ashing power level and ashing duration.

Referring to FIG. 2I, the process in some embodiments further includes removing the second photoresist layer thereby forming the active layer. The active layer includes a portion 210 in the channel region, a first doped portion 2081 in the first doped region, a second doped portion 2082 in the second doped region, a third doped portion 2091 in the third doped region, and a fourth doped portion 2092 in the fourth doped region.

Optionally, the thin film transistor is a top gate-type thin film transistor. Optionally, prior to forming the semiconductor layer, the process further includes forming a light shielding layer on the base substrate; and forming a second buffer layer on a side of the gate electrode layer distal to the base substrate. The second buffer layer is formed between the light shielding layer and the semiconductor layer. Optionally, subsequent to formation of the active layer (including all doping steps), the source electrode, and the drain electrode, the process further includes forming a gate insulating layer on a side of the active layer distal to the second buffer layer, and forming a gate electrode layer on a side of the gate insulating layer distal to the active layer.

Figure 3A:
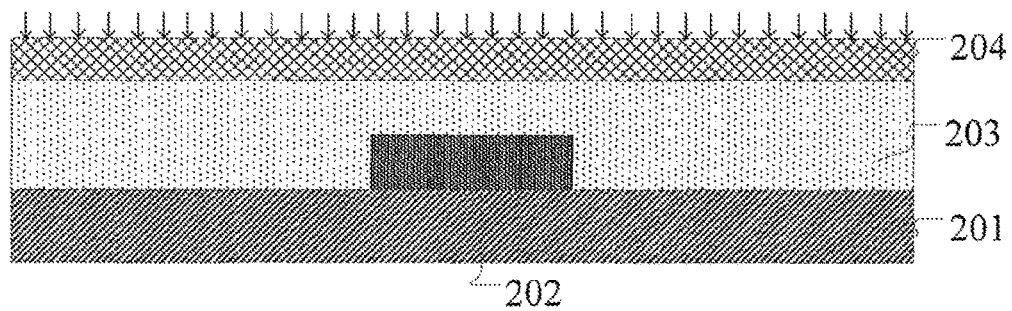
FIGS. 3A-3I illustrate a process of fabricating bottom gate-type a thin film transistor in some embodiments according to the present disclosure.
Figure 3B:
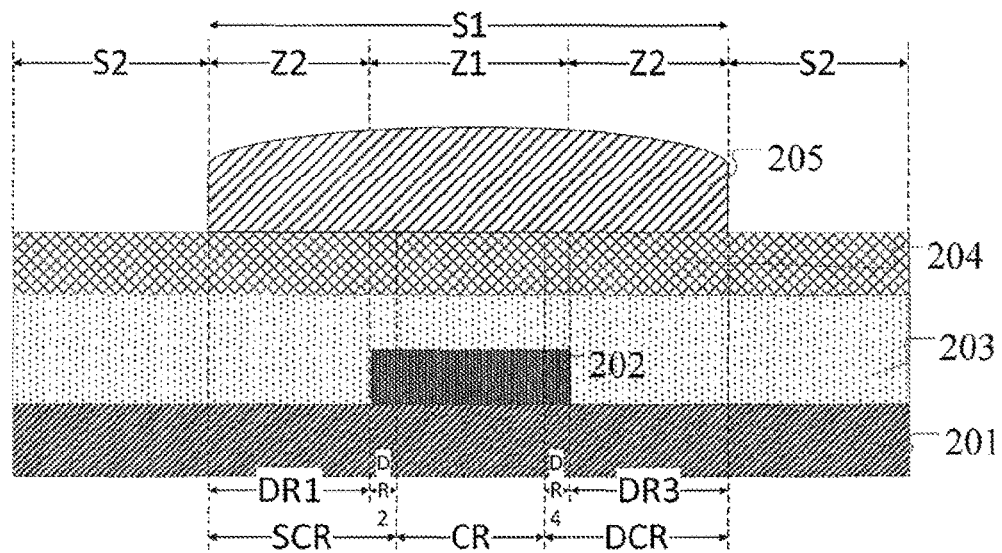
Figure 3C:
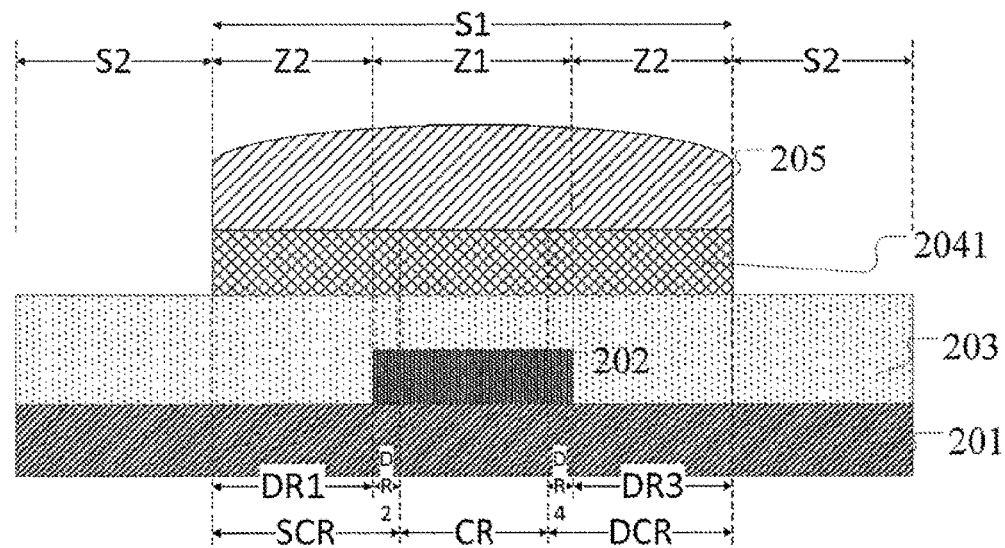

FIGS. 3A-3I illustrate a process of fabricating a bottom gate-type thin film transistor in some embodiments according to the present disclosure. Referring to FIG. 3A, the process in some embodiments includes forming a gate electrode layer 202 on the base substrate, forming a first buffer layer 203 on a side of the gate electrode layer 202 distal to the base substrate 201, forming a semiconductor material layer 204 on a side of the first buffer layer 203 distal to the base substrate 201, and doping the semiconductor material layer 204 with a dopant. By having this step, an active layer formed by the present method includes a doped channel region. By selecting an appropriate dopant and a doping concentration, the threshold voltage of the thin film transistor can be adjusted. Optionally, the doping is performed by a doping implantation process using an N-type dopant, e.g., phosphor. Optionally, the doping is performed by a doping implantation process using a P-type dopant, e.g., boron In some embodiments, the process in some embodiments further includes forming a photoresist material layer on a side of the semiconductor material layer distal to the base substrate, and patterning the photoresist material layer to form a third photoresist layer having a pattern corresponding to the active layer. Referring to FIG. 3B, the process in some embodiments includes forming a semiconductor material layer 204 on the base substrate 201; forming a photoresist material layer on a side of the semiconductor material layer 204 distal to the base substrate 201; exposing the photoresist material layer with a mask plate, and developing an exposed photoresist material layer to obtain a photoresist pattern having a first section S1 corresponding to the active layer, a second section S2 outside of the first region S1. As shown in FIG. 3B, the photoresist material is removed in the second section S2 thereby forming a third photoresist layer 205 in the first section S1. Referring to FIG. 3C, the semiconductor material layer in the second section S2 is then removed to form a semiconductor layer 2041 in the first section S1. Optionally, the third photoresist layer 205 has a substantially uniform thickness.

Figure 3D:
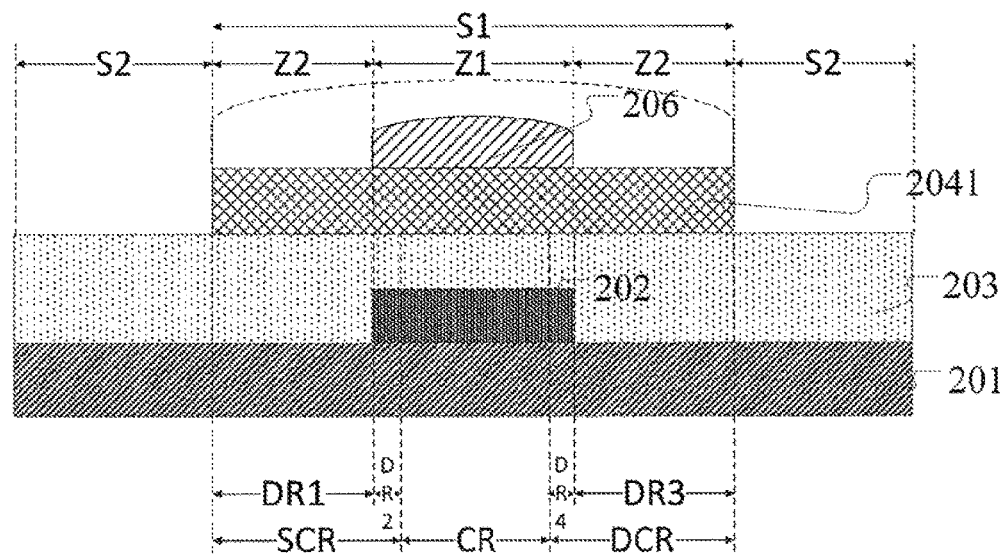

Referring to FIG. 3D, the process in some embodiments further includes forming a first photoresist layer 206. For example, the first photoresist layer 206 may be formed by reducing a thickness and a width of the third photoresist layer. In some embodiments, the step of forming the first photoresist layer 206 includes removing (e.g., by ashing) the third photoresist layer 205 in the second zone Z2 (corresponding to the first doped region DR1 and the third doped region DR3), thereby exposing a region of the semiconductor layer corresponding to the first doped region DR1 and the third doped region DR3. Photoresist material in the first zone Z1 (corresponding to the second doped region DR2 and the fourth doped region DR4) remains with a reduced thickness subsequent to ashing, thereby forming the first photoresist layer 206. Optionally, the first photoresist layer 206 has a substantially uniform thickness.

Figure 3E:
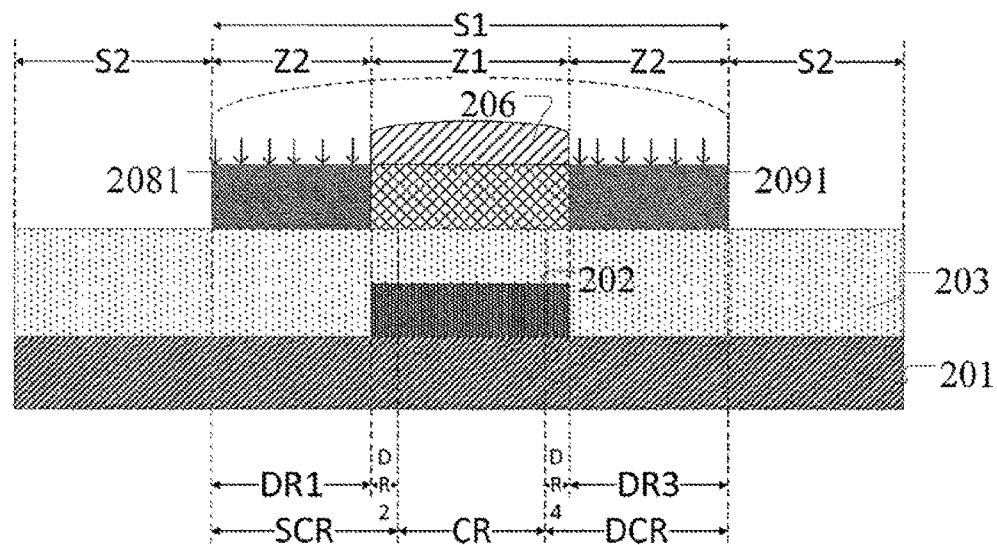

Referring to FIG. 3E, the process in some embodiments further includes doping a region of the semiconductor layer corresponding to the first doped region DR1 and the third doped region DR3 (e.g., the second zone Z2) using the first photoresist layer 206 as a mask plate. Optionally, the doping is performed by a doping implantation process using an N-type dopant, e.g., phosphor. Optionally, the doping is performed by a doping implantation process using a P-type dopant, e.g., boron. Optionally, the doping is performed using a heavy doping implantation process. Subsequent to the doping step, the semiconductor layer includes a heavy doped source contact region 2081 corresponding to the first doped region DR1 in the active layer, and a heavy doped drain contact region 2091 corresponding to the third doped region DR3 in the active layer.

Figure 3F:
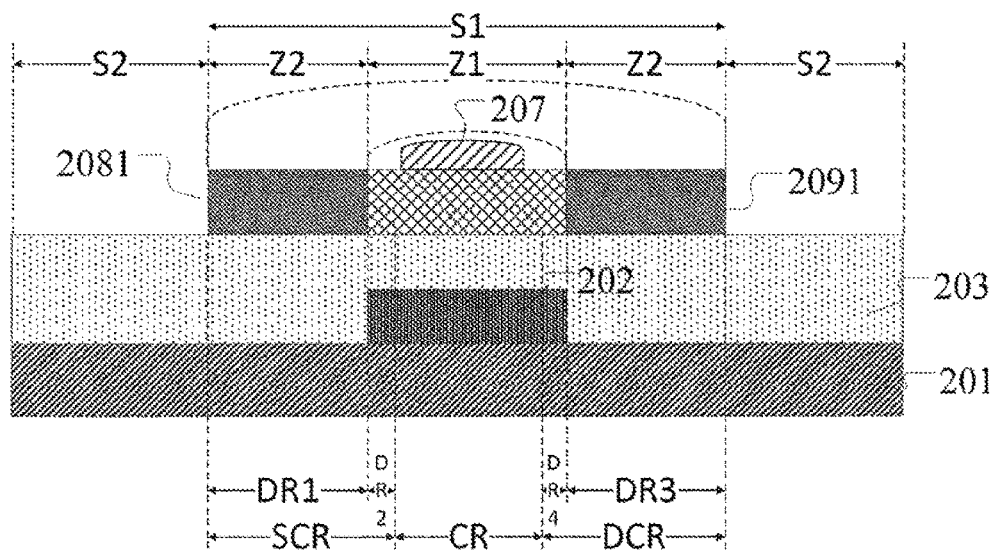

Referring to FIG. 3F, the process in some embodiments further includes forming a second photoresist layer 207. For example, the second photoresist layer 207 may be formed by reducing a thickness and a width of the first photoresist layer. In some embodiments, the step of forming the second photoresist layer 207 includes removing a portion of the first photoresist layer to expose a portion of the semiconductor layer corresponding to at least a portion of the second doped region DR2 and at least a portion of the fourth doped region DR4. Optionally, the second photoresist layer 207 has a substantially uniform thickness.

Figure 3G:
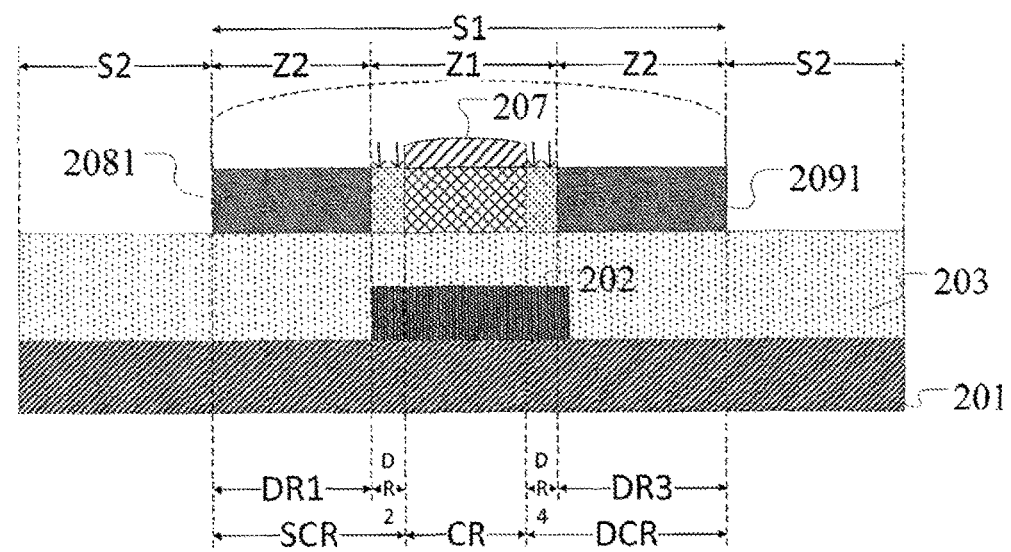

Referring to FIG. 3G, the process in some embodiments further includes doping the portion of the semiconductor layer exposed in the step of forming the second photoresist layer 207 (e.g., at least a portion of the second doped region DR2 and at least a portion of the fourth doped region DR4), using the second photoresist layer 207 as a mask plate. Optionally, the doping is performed by a doping implantation process using an N-type dopant, e.g., phosphor. Optionally, the doping is performed by a doping implantation process using a P-type dopant, e.g., boron. Optionally, the doping is performed using a light doping implantation process. Subsequent to the doping step, the semiconductor layer includes a light doped source contact region 2082 corresponding to the second doped region DR2 in the active layer, and a light doped drain contact region 2092 corresponding to the fourth doped region DR4 in the active layer (see FIG. 3H).

In some embodiments, the second doped region includes a plurality of second doped sub-regions, a dopant concentration in the plurality of second doped sub-regions decreases along a direction from the first doped region to the channel region; the fourth doped region includes a plurality of fourth doped sub-regions, a dopant concentration in the plurality of fourth doped sub-regions decreases along a direction from the third doped region to the channel region. This design can be made possible by removing a portion of the second photoresist layer a plurality of times, and performed a doping process each time a portion of the second photoresist layer is removed using the remaining second photoresist as a mask plate.

In some embodiments, the process in some embodiments includes forming a second photoresist layer by removing a portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is limited to the first portion of the semiconductor layer only. Optionally, the step of doping the first portion of the semiconductor layer is a light doping implantation process. Subsequent to doping the first portion of the semiconductor layer, the region of the semiconductor layer corresponding to the first doped region and the third doped region has a higher dopant concentration than that of the first portion of the semiconductor layer.

In some embodiments, subsequent to doping the first portion of the semiconductor layer, the process in some embodiments further includes performing the following steps at least once: removing a portion of the second photoresist layer to expose a second portion of the semiconductor layer corresponding to an additional portion of the second doped region and an additional portion of the fourth doped region; and doping the second portion of the semiconductor layer using the remaining second photoresist layer as a mask plate. The additional portion of the second doped region is between the channel region and the portion of the second doped region exposed when a portion of the first photoresist layer is removed, the additional portion of the fourth doped region is between the channel region and the portion of the fourth doped region exposed when a portion of the first photoresist layer is removed. The first portion of the semiconductor layer has a higher dopant concentration than that of the second portion of the semiconductor layer. By having this iterative doping process, the second doped region can be made to include a plurality of second doped sub-regions and the fourth doped region can be made to include a plurality of fourth doped sub-regions.

Figure 3H:
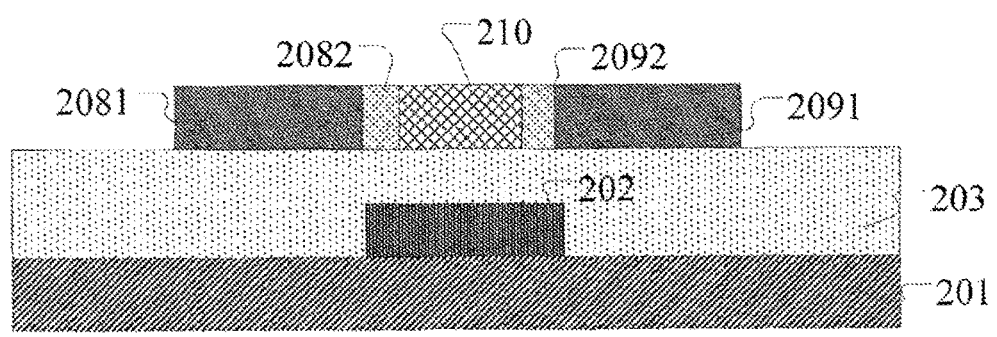
Figure 3I:
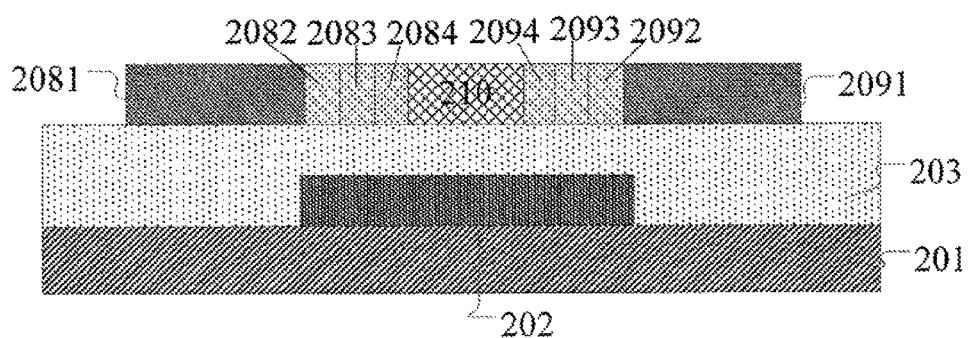
Figure 4A:
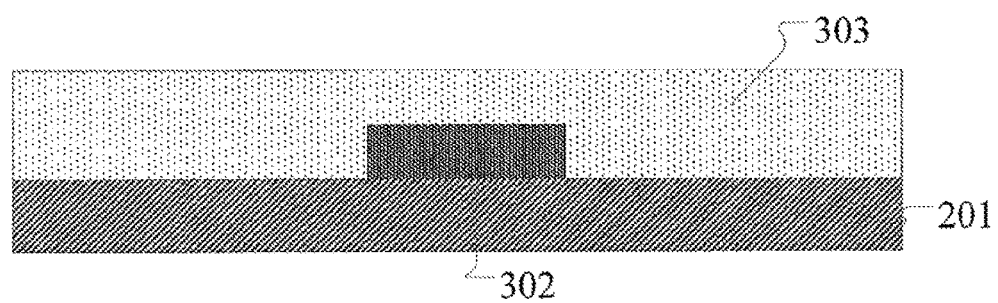
FIGS. 4A-4J illustrate a process of fabricating a top gate-type thin film transistor in some embodiments according to the present disclosure.
Figure 4B:
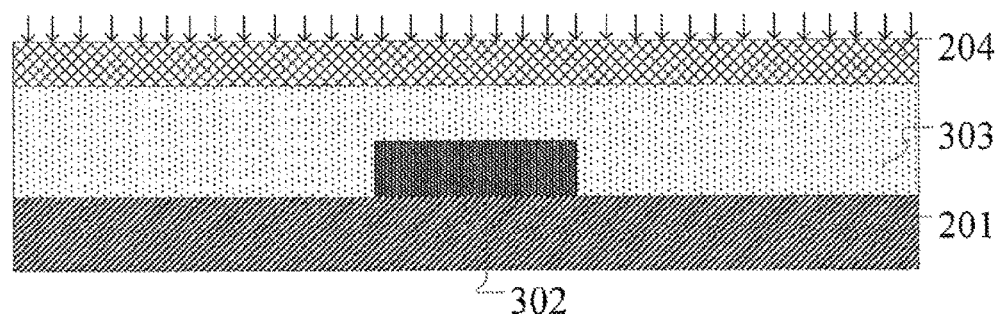
Figure 4C:
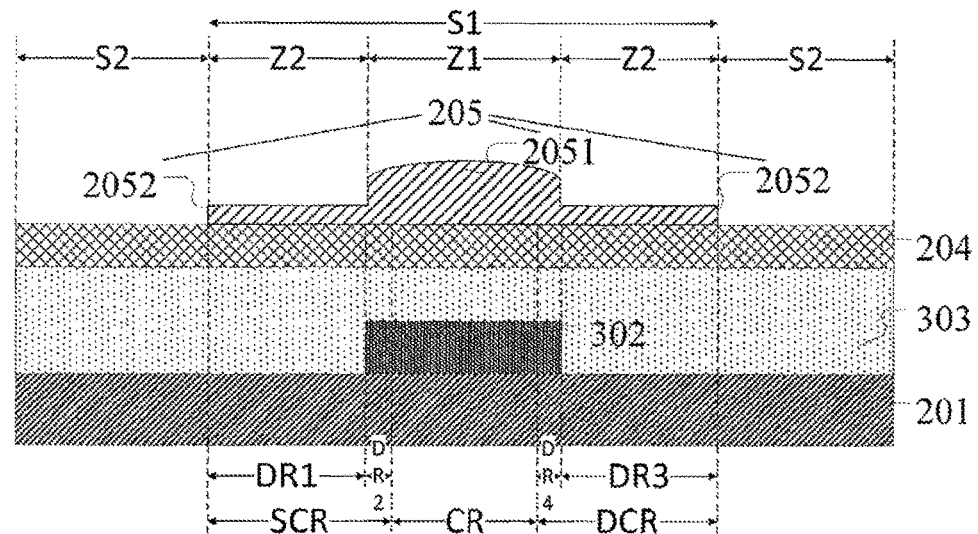
Figure 4D:
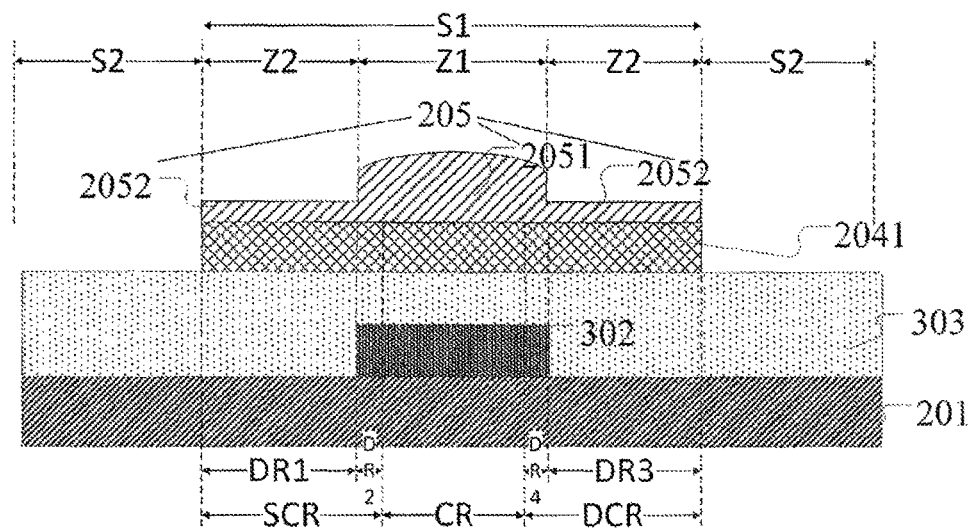
Figure 4E:
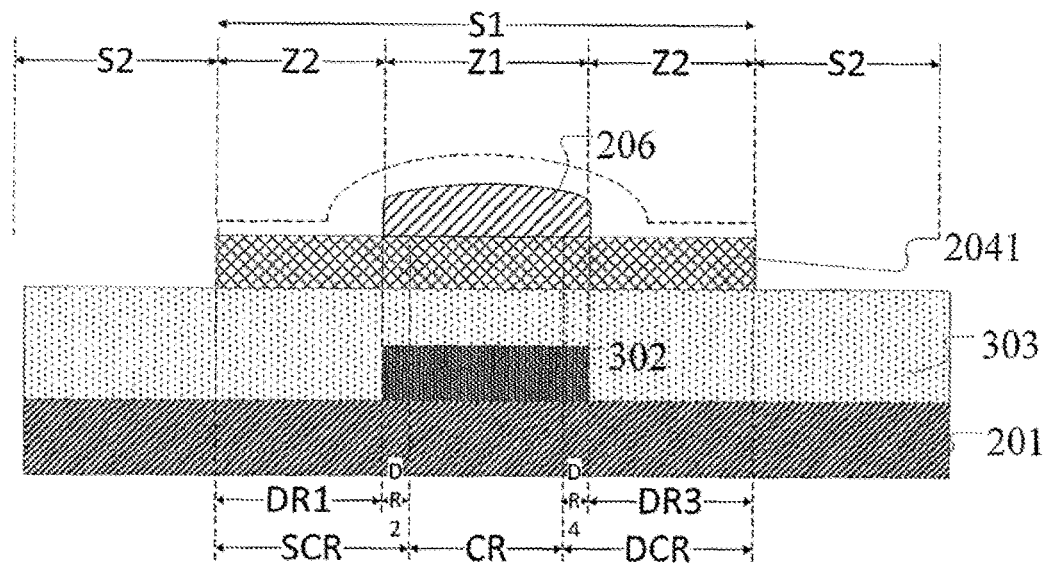
Figure 4F:
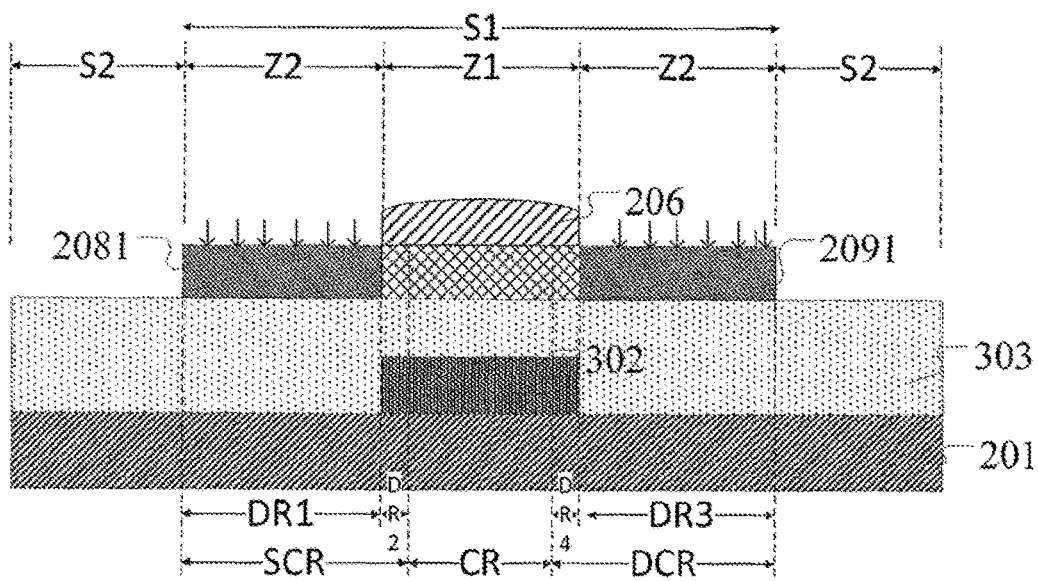
Figure 4G:
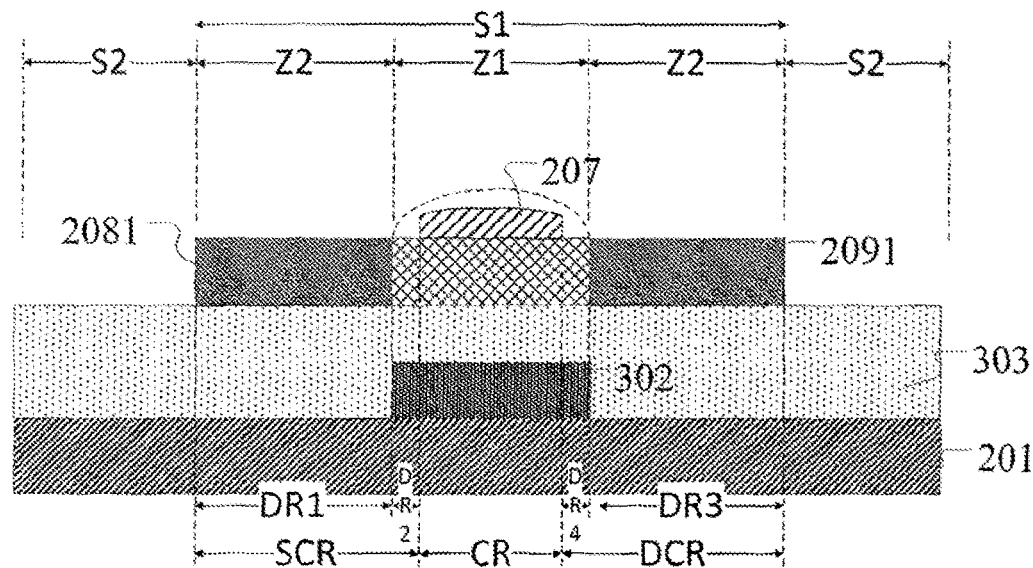
Figure 4H:
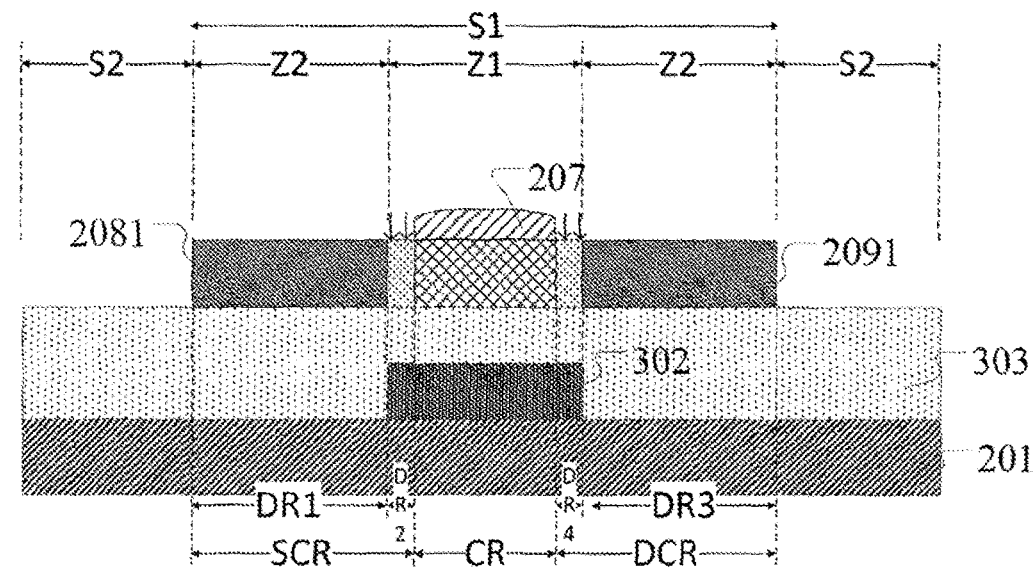
Figure 4I:
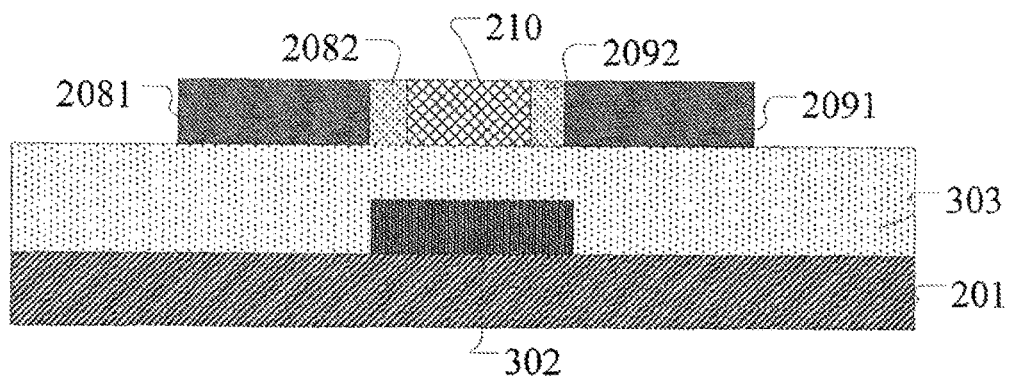
Figure 4J:
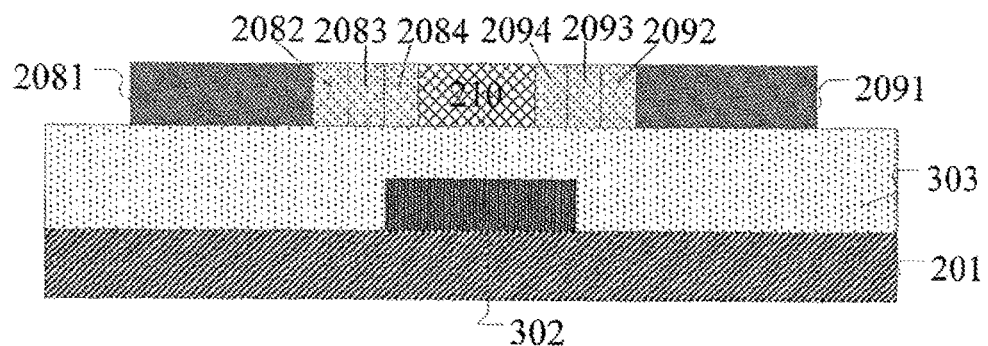
Figure 5A:
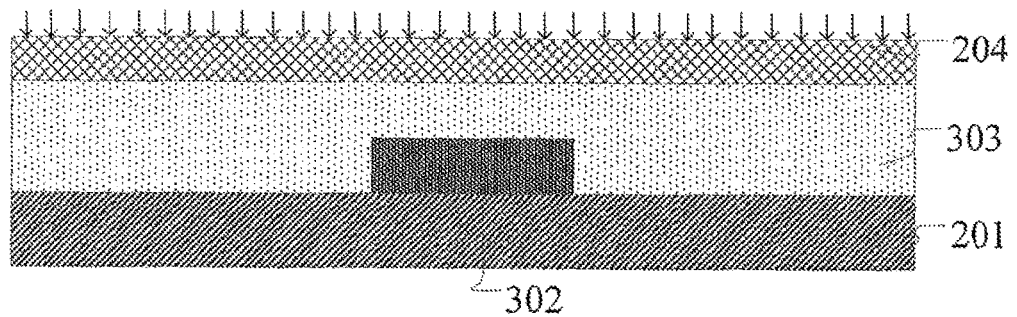
FIGS. 5A-5I illustrate a process of fabricating a top gate-type thin film transistor in some embodiments according to the present disclosure.
Figure 5B:
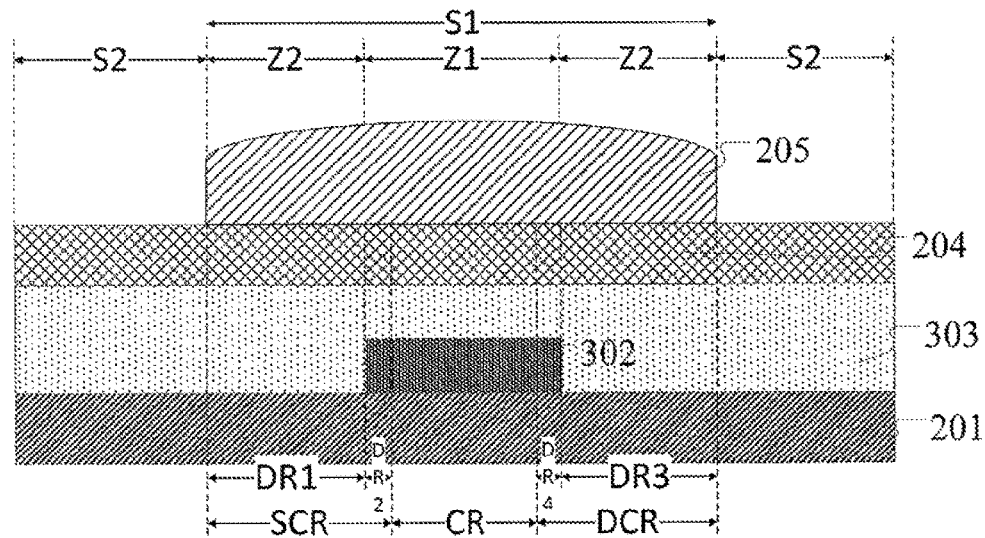
Figure 5C:
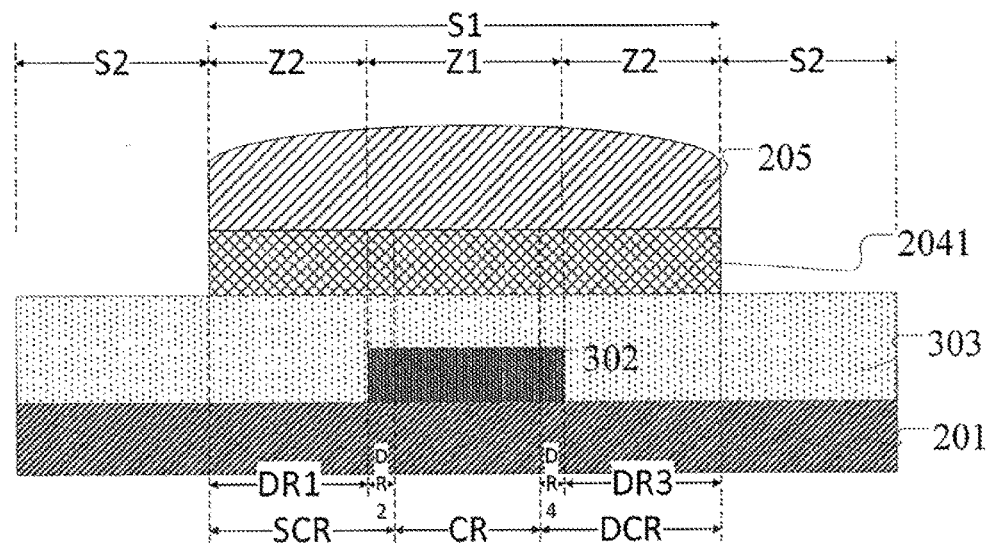
Figure 5D:
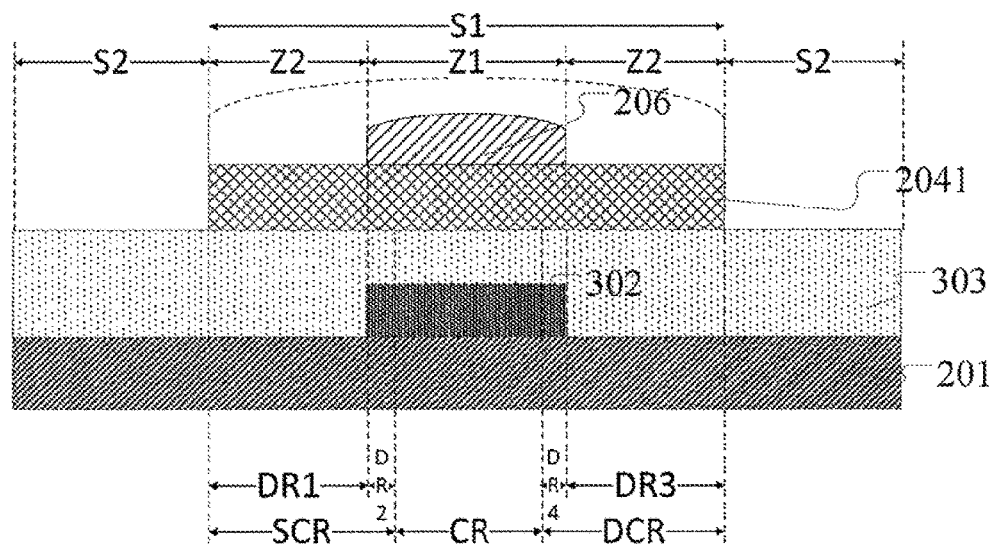
Figure 5E:
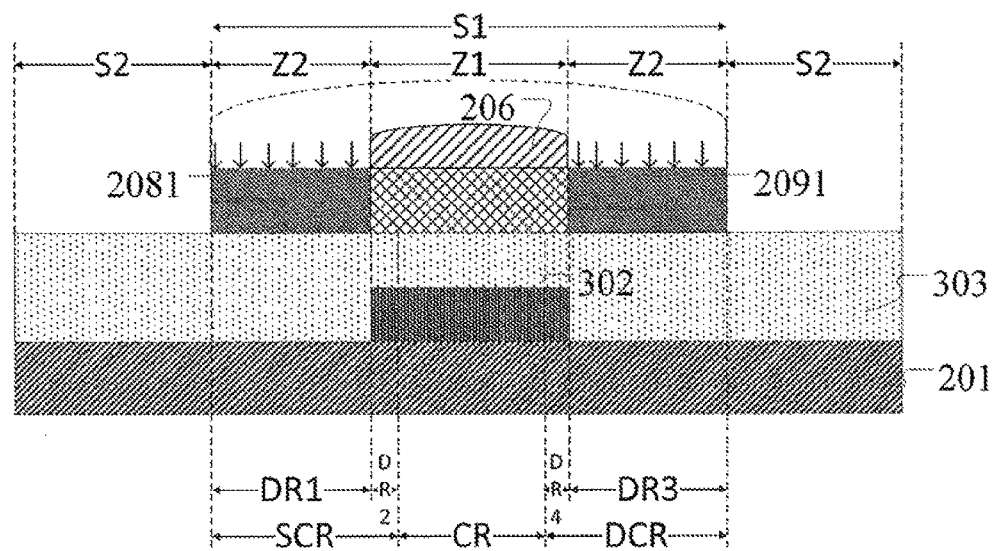
Figure 5F:
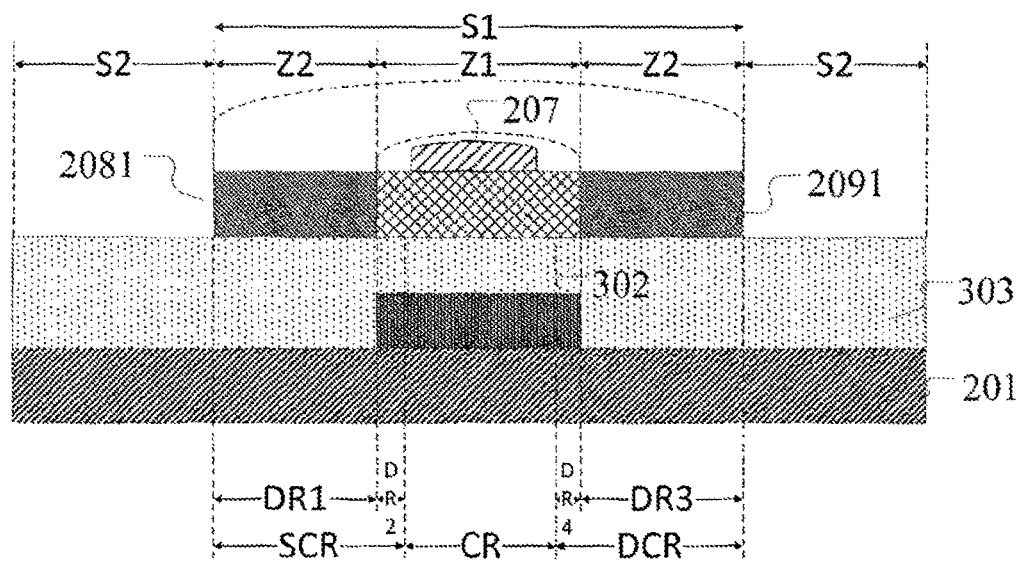
Figure 5G:
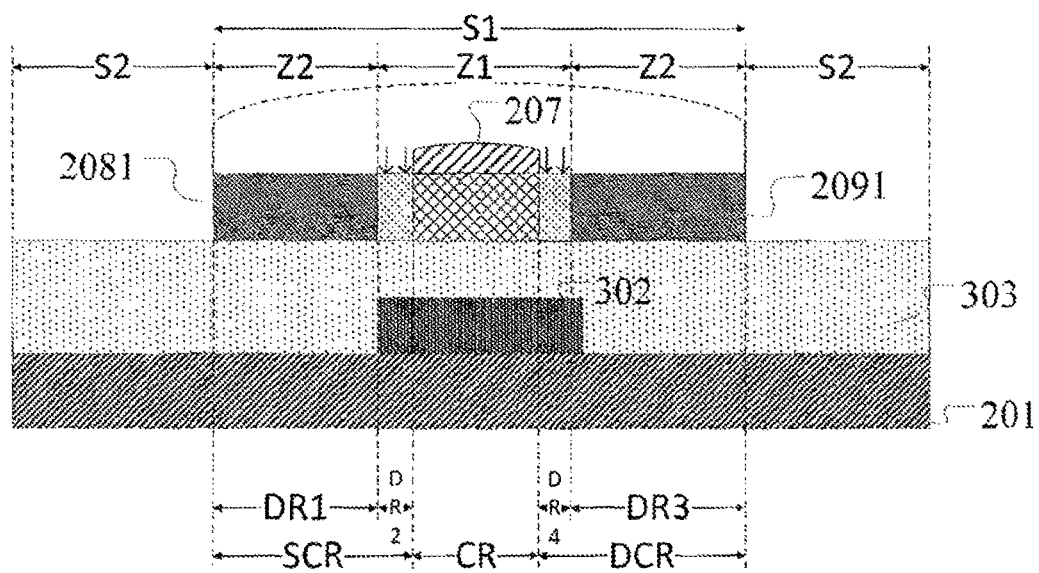
Figure 5H:
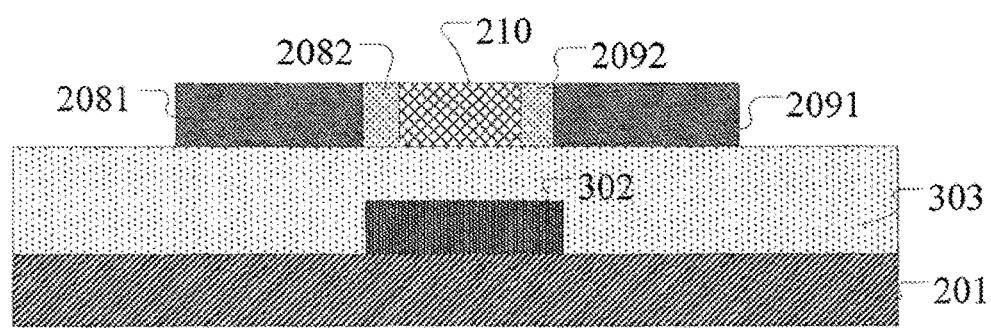
Figure 5I:
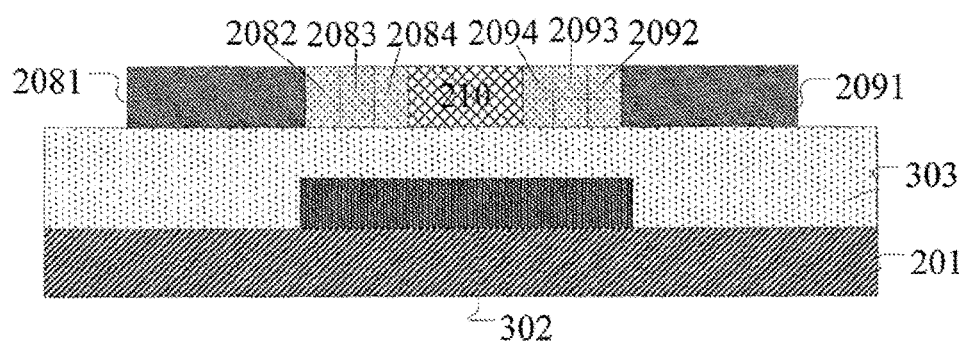

Referring to FIG. 3I, the process in some embodiments include repeating the steps of removing a portion of the second photoresist layer and doping the newly exposed portion of the semiconductor layer twice. As a result, the second doped region includes three second doped sub-regions, i.e., 2082, 2083, and 2084, the fourth doped region include three fourth doped sub-regions, i.e., 2092, 2093, and 2094. The second doped sub-region 2082 and the fourth doped sub-region 2092 are formed when the removing and doping processes are performed the first time. The second doped sub-region 2083 and the fourth doped sub-region 2093 are formed when the removing and doping processes are repeated. The second doped sub-region 2084 and the fourth doped sub-region 2094 are formed when the removing and doping processes are repeated the second time. The second doped sub-region 2082 has a higher dopant concentration than that of the second doped sub-region 2083, which in turn has a higher dopant concentration than that of the second doped sub-region 2084. The fourth doped sub-region 2092 has a higher dopant concentration than that of the fourth doped sub-region 2093, which in turn has a higher dopant concentration than that of the fourth doped sub-region 2094. The first doped region 2081 has a higher dopant concentration than that of the second doped sub-regions 2082, 2083, and 2084. The third doped region 2091 has a higher dopant concentration than that of the fourth doped sub-regions 2092, 2093, and 2094. Optionally, the second doped sub-region 2084 is un-doped. Optionally, the fourth doped sub-region 2094 is un-doped.

In some embodiments, the process in some embodiments includes forming a second photoresist layer by removing a first portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is performed by doping, in a same process, the region of the semiconductor layer corresponding to the first doped region and the third doped region, and the first portion of the semiconductor layer. Optionally, the doping process is a heavy doping implantation process. Subsequent to the doping process, the region of the semiconductor layer corresponding to the first doped region and the third doped region has a higher dopant concentration than that of the first portion of the semiconductor layer, because the region of the semiconductor layer corresponding to the first doped region and the third doped region have been doped twice whereas the first portion of the semiconductor layer has only been doped once so far.

In some embodiments, subsequent to doping the first portion of the semiconductor layer, the process in some embodiments further includes performing following steps at least once: removing a portion of the second photoresist layer to expose a second portion of the semiconductor layer corresponding to an additional portion of the second doped region and an additional portion of the fourth doped region; and doping, in a same process, the region of the semiconductor layer corresponding to the first doped region and the third doped region, the first portion of the semiconductor layer, and the second portion of the semiconductor layer. The additional portion of the second doped region is between the channel region and the portion of the second doped region exposed when a portion of the first photoresist layer is removed, the additional portion of the fourth doped region is between the channel region and the portion of the fourth doped region exposed when a portion of the first photoresist layer is removed. The first portion of the semiconductor layer has a higher dopant concentration than that of the second portion of the semiconductor layer. A dopant concentration in the source contact region decreases along a direction from the first doped region to the channel region. A dopant concentration in the drain contact region decreases along a direction from the third doped region to the channel region.

Referring to FIG. 3I, the process in some embodiments include repeating the steps of removing a portion of the second photoresist layer and doping all exposed portions of the semiconductor layer twice. As a result, the second doped region includes three second doped sub-regions, i.e., 2082, 2083, and 2084, the fourth doped region include three fourth doped sub-regions, i.e., 2092, 2093, and 2094. The second doped sub-region 2082 and the fourth doped sub-region 2092 are formed when the removing and doping processes are performed the first time. The second doped sub-region 2083 and the fourth doped sub-region 2093 are formed when the removing and doping processes are repeated. The second doped sub-region 2084 and the fourth doped sub-region 2094 are formed when the removing and doping processes are repeated the second time. The second doped sub-region 2082 has a higher dopant concentration than that of the second doped sub-region 2083, which in turn has a higher dopant concentration than that of the second doped sub-region 2084. The fourth doped sub-region 2092 has a higher dopant concentration than that of the fourth doped sub-region 2093, which in turn has a higher dopant concentration than that of the fourth doped sub-region 2094. The first doped region 2081 has a higher dopant concentration than that of the second doped sub-regions 2082, 2083, and 2084. The third doped region 2091 has a higher dopant concentration than that of the fourth doped sub-regions 2092, 2093, and 2094.

Referring to FIG. 3H, the process in some embodiments further includes removing the second photoresist layer thereby forming the active layer. The active layer includes a portion 210 in the channel region, a first doped portion 2081 in the first doped region, a second doped portion 2082 in the second doped region, a third doped portion 2091 in the third doped region, and a fourth doped portion 2092 in the fourth doped region. Optionally, the mask plate for patterning the photoresist layer may be a normal mask plate, e.g., not a half-tone mask plate or a gray-tone mask plate.

Optionally, the thin film transistor is a top gate-type thin film transistor. Optionally, prior to forming the semiconductor layer, the process further includes forming a light shielding layer on the base substrate; and forming a second buffer layer on a side of the gate electrode layer distal to the base substrate. The second buffer layer is formed between the light shielding layer and the semiconductor layer. Optionally, subsequent to formation of the active layer (including all doping steps), the source electrode, and the drain electrode, the process further includes forming a gate insulating layer on a side of the active layer distal to the second buffer layer, and forming a gate electrode layer on a side of the gate insulating layer distal to the active layer.

FIGS. 4A-4I and FIGS. 5A-5H illustrate a process of fabricating a top gate-type thin film transistor in some embodiments according to the present disclosure. In a bottom gate-type thin film transistor (see, e.g., FIGS. 2A-2J and FIGS. 3A-3I), the active layer (and the semiconductor material layer 204 for forming the active layer) is formed on a first buffer layer 203, which is formed on side of a gate electrode layer 202 distal to the base substrate 201. Referring to FIGS. 4A-4I and FIGS. 5A-5H, in a top gate-type thin film transistor, the active layer (including a portion 210 in the channel region, a first doped portion 2081, a second doped region 2082, a third doped portion 2091, a fourth doped region 2092, and so on) and the semiconductor material layer 204 for forming the active layer are formed on a second buffer layer 303, which is formed on a side of a light shielding layer 302 distal to the base substrate 201. In one example, the process of forming a top gate-type thin film transistor includes forming a light shielding layer 302 on the base substrate 201, forming a second buffer layer 303 on a side of the light shielding layer 302 distal to the base substrate 201, forming a semiconductor material layer 204 on a side of the second buffer layer 303 distal to the light shielding layer 302. Once the semiconductor material layer 204 is formed, the remaining steps of the process are similar to those for fabricating a bottom gate-type thin film transistor, for example, those illustrated in FIGS. 2B-2J and FIG. 3A-3I.

Figure 6A:
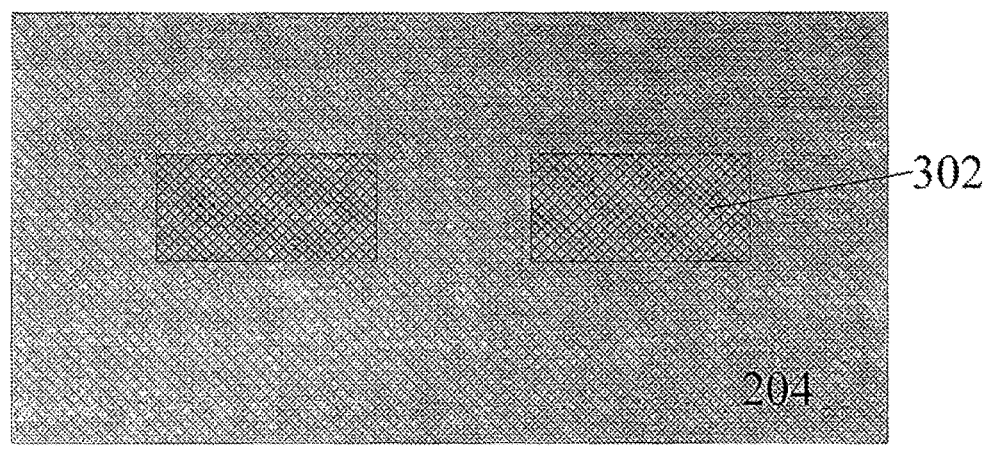
FIGS. 6A-6G illustrate a process of fabricating a top gate-type thin film transistor in some embodiments according to the present disclosure.

FIGS. 6A-6G illustrate a process of fabricating a top gate-type thin film transistor in some embodiments according to the present disclosure. The thin film transistor in FIGS. 6A-6G is a dual gate-type thin film transistor. Referring to FIG. 6A, the process in some embodiments includes forming a light shielding layer 302 on the base substrate; forming a second buffer layer (not explicitly shown in FIG. 6A) on a side of the light shielding layer 302 distal to the base substrate; forming a semiconductor material layer 204 on a side of the second buffer layer distal to the base substrate; and optionally doping the semiconductor material layer 204 with a dopant. If the process includes a step of doping the semiconductor material layer 204 with a dopant, a doped channel region is formed for adjusting the threshold voltage of the thin film transistor.

Figure 6B:
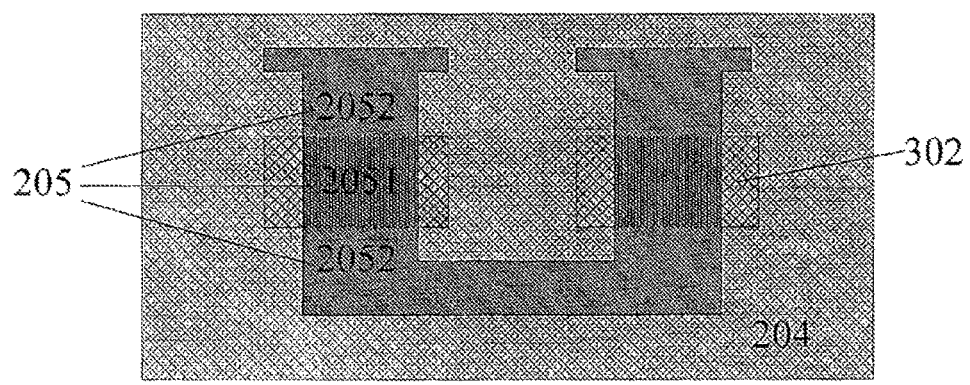

Referring to FIG. 6B, the process in some embodiments further includes forming a photoresist material layer on a side of the semiconductor material layer 204 distal to the base substrate, and patterning the photoresist material layer to form a third photoresist layer 205 having a pattern corresponding to the active layer. As shown in FIG. 6B, the third photoresist layer 205 includes two portions having different thicknesses, including a first portion 2051 and a second portion 2052, the second portion 2052 having a thickness smaller than the first portion 2051. The second portion 2052 is on two sides of the first portion 2051. Optionally, the first portion 2051 has a substantially uniform thickness. Optionally, the second portion 2052 has a substantially uniform thickness. Optionally, the third photoresist layer 205 is formed using a half-tone mask plate or a gray-tone mask plate.

Figure 6C:
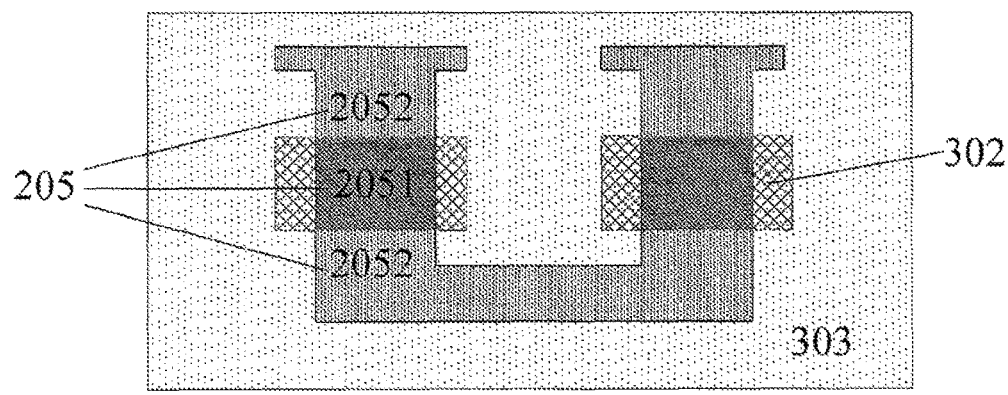

Referring to FIG. 6C, subsequent to forming the third photoresist layer 205, semiconductor material layer in a region outside that corresponding to the third photoresist layer 205 is removed, thereby forming a semiconductor layer (not explicitly shown in FIG. 6C).

Figure 6D:
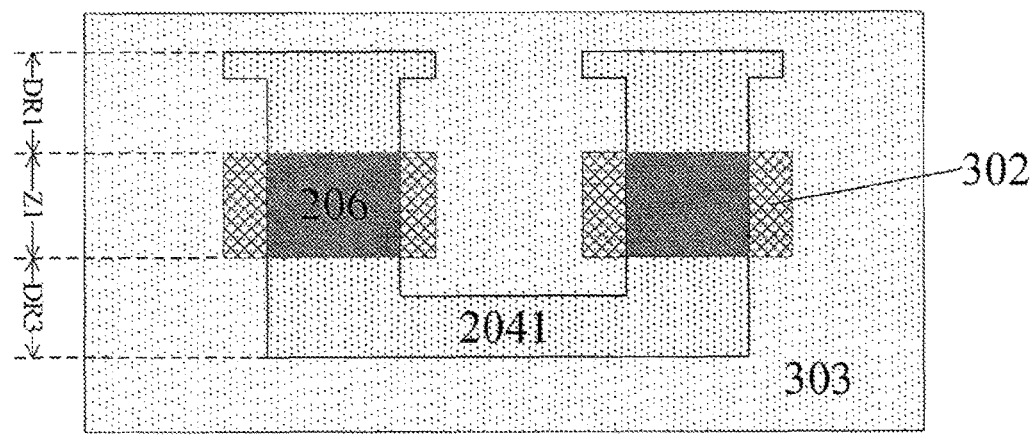
Figure 6E:
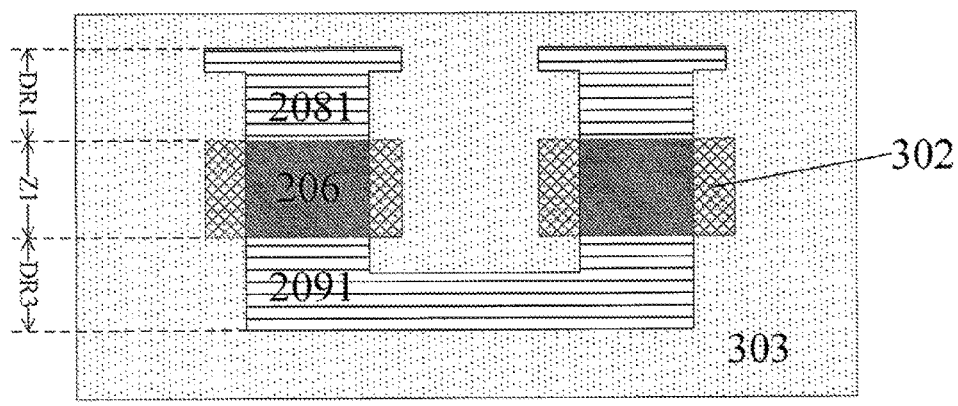

Referring to FIG. 6D, the process in some embodiments further includes forming a first photoresist layer 206. For example, the first photoresist layer 206 may be formed by reducing a thickness and a width of the third photoresist layer. In some embodiments, the step of forming the first photoresist layer 206 includes removing (e.g., by ashing) the second portion of the third photoresist layer (e.g., 2052 in FIG. 6C) thereby exposing a region of the semiconductor layer 2041 corresponding to the first doped region DR1 and the third doped region DR3. Photoresist material in the first zone Z1 remains with a reduced thickness subsequent to ashing, thereby forming the first photoresist layer 206. Optionally, the first photoresist layer 206 has a substantially uniform thickness Referring to FIG. 6E, the process in some embodiments further includes doping a region of the semiconductor layer corresponding to the first doped region DR1 and the third doped region DR3 using the first photoresist layer 206 as a mask plate. Optionally, the doping is performed using a heavy doping implantation process. Optionally, the doping is performed using a heavy doping implantation process. Subsequent to the doping step, the semiconductor layer includes a heavy doped source contact region 2081 corresponding to the first doped region DR1 in the active layer, and a heavy doped drain contact region 2091 corresponding to the third doped region DR3 in the active layer.

Figure 6F:
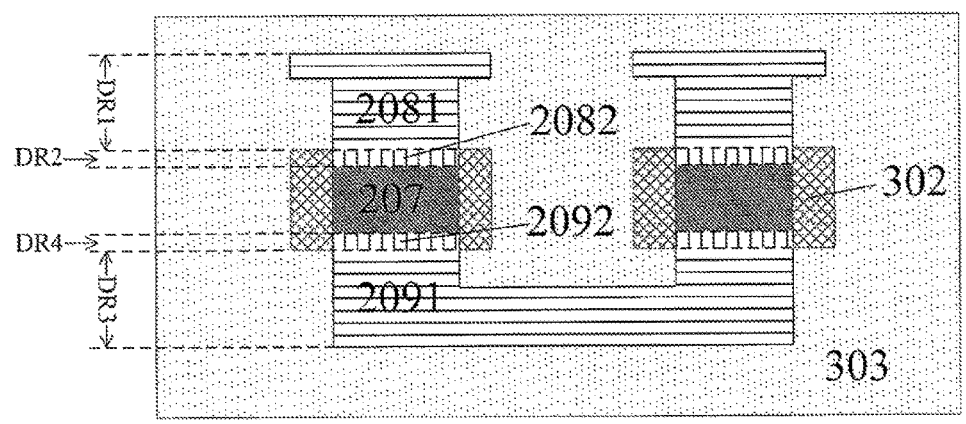

Referring to FIG. 6F, the process in some embodiments further includes forming a second photoresist layer 207. For example, the second photoresist layer 207 may be formed by reducing a thickness and a width of the first photoresist layer. In some embodiments, the step of forming the second photoresist layer 207 includes removing a portion of the first photoresist layer to expose a portion of the semiconductor layer corresponding to at least a portion of the second doped region DR2 and at least a portion of the fourth doped region DR4. Optionally, the second photoresist layer 207 has a substantially uniform thickness. The process in some embodiments further includes doping the portion of the semiconductor layer exposed in the step of forming the second photoresist layer 207 (e.g., at least a portion of the second doped region DR2 and at least a portion of the fourth doped region DR4), using the second photoresist layer 207 as a mask plate. Optionally, the doping is performed using a light doping implantation process. Subsequent to the doping step, the semiconductor layer includes a light doped source contact region 2082 corresponding to the second doped region DR2 in the active layer, and a light doped drain contact region 2092 corresponding to the fourth doped region DR4 in the active layer.

In some embodiments, the process further includes forming a source electrode on a side of the first doped region 2081 and the second doped region 2082 distal to the second buffer layer 303, and forming a drain electrode 400 on a side of the third doped region 2091 and the fourth doped region 2092 distal to the second buffer layer 303, the source electrode 300 being in contact with the first doped region 2081 and the second doped region 2082, and the drain electrode 400 being in contact with the third doped region 2091 and the fourth doped region 2092. The method in some embodiments further includes forming a first electrode layer 212 on a side of the second buffer layer 303 distal to the base substrate 201.

Figure 6G:
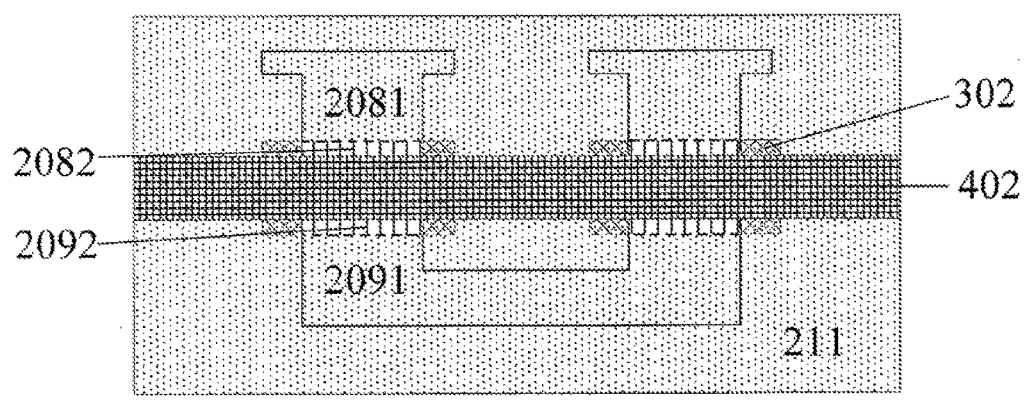

Referring to FIG. 6G, the process in some embodiments further includes forming a passivation layer 211 on a side of the thin film transistor and the second buffer layer 303 distal to the base substrate 201, forming a gate electrode 402 on a side of the passivation layer 211 distal to the second buffer layer 303.

Figure 7:
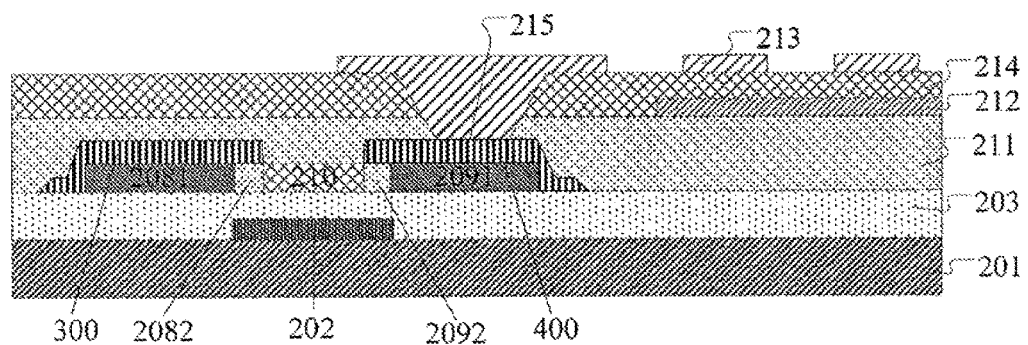
FIG. 7 is a cross-sectional view of a display substrate in some embodiments according to the present disclosure.

FIG. 7 is a cross-sectional view of a display substrate in some embodiments according to the present disclosure. The thin film transistor in the display substrate of FIG. 7 is a bottom gate-type thin film transistor. Referring to FIG. 7, the method of fabricating a thin film transistor in some embodiments further includes forming a source electrode 300 on a side of the first doped region 2081 and the second doped region 2082 distal to the first buffer layer 203, and forming a drain electrode 400 on a side of the third doped region 2091 and the fourth doped region 2092 distal to the first buffer layer 203, the source electrode 300 being in contact with the first doped region 2081 and the second doped region 2082, and the drain electrode 400 being in contact with the third doped region 2091 and the fourth doped region 2092. The method in some embodiments further includes forming a passivation layer 211 on a side of the thin film transistor and the first buffer layer 203 distal to the base substrate 201; forming a first electrode layer 212 on a side of the passivation layer 211 distal to the first buffer layer 203, forming an insulating layer 214 on a side of the first electrode layer 212 and the passivation layer 211 distal to the first buffer layer 203, forming a via 215 extending through the insulating layer 214 and the passivation layer 211, forming a second electrode layer 213 on a side of the insulating layer 214 distal to the passivation layer 211, the second electrode layer 213 electrically connected to the drain electrode 400 through the via 215. Optionally, the first electrode layer 212 is a common electrode layer, and the second electrode layer 213 is a pixel electrode layer.

Accordingly, the display substrate in FIG. 7 includes a base substrate 201, a gate electrode 202 on the base substrate 201, a first buffer layer 203 on a side of the gate electrode 202 distal to the base substrate 201, and an active layer on a side of the first buffer layer 203 distal to the base substrate 201. The active layer includes a first doped region 2081, a second doped region 2082, a third doped region 2091, and a fourth doped region 2092. The first doped region 2081 has a higher dopant concentration than that of the second doped region 2082, and the third doped region 2091 has a higher dopant concentration that that of the fourth doped region 2092. The display substrate further includes a source electrode 300 and a drain electrode 400 on a side of the active layer distal to the first buffer layer 203, the source electrode 300 is in contact with the first doped region 2081 and the second doped region 2082, and the drain electrode 400 is in contact with the third doped region 2091 and the fourth doped region 2092. The display substrate further includes a passivation layer 211 on a side of the thin film transistor and the first buffer layer 203 distal to the base substrate 201; a first electrode layer 212 on a side of the passivation layer 211 distal to the first buffer layer 203, an insulating layer 214 on a side of the first electrode layer 212 and the passivation layer 211 distal to the first buffer layer 203, a via 215 extending through the insulating layer 214 and the passivation layer 211, a second electrode layer 213 on a side of the insulating layer 214 distal to the passivation layer 211, the second electrode layer 213 electrically connected to the drain electrode 400 through the via 215. Optionally, the first electrode layer 212 is a common electrode layer, and the second electrode layer 213 is a pixel electrode layer.

Figure 8:
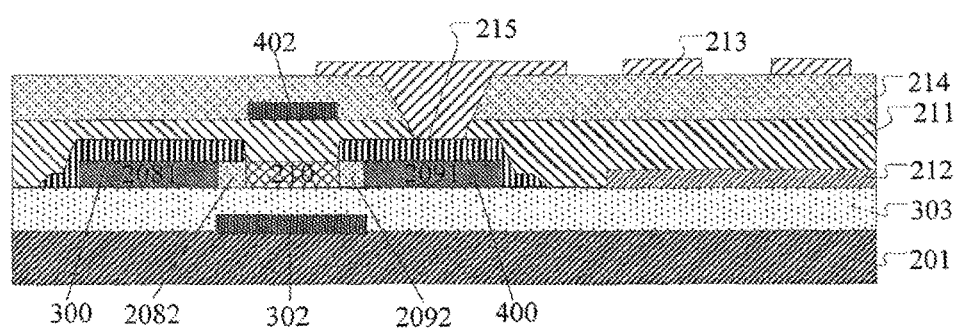
FIG. 8 is a cross-sectional view of a display substrate in some embodiments according to the present disclosure.

FIG. 8 is a cross-sectional view of a display substrate in some embodiments according to the present disclosure. The thin film transistor in the display substrate of FIG. 8 is a top gate-type thin film transistor. Referring to FIG. 8, a method of fabricating a thin film transistor in some embodiments further includes forming a source electrode 300 on a side of the first doped region 2081 and the second doped region 2082 distal to the second buffer layer 303, and forming a drain electrode 400 on a side of the third doped region 2091 and the fourth doped region 2092 distal to the second buffer layer 303, the source electrode 300 being in contact with the first doped region 2081 and the second doped region 2082, and the drain electrode 400 being in contact with the third doped region 2091 and the fourth doped region 2092. The method in some embodiments further includes forming a first electrode layer 212 on a side of the second buffer layer 303 distal to the base substrate 201, forming a passivation layer 211 on a side of the thin film transistor and the second buffer layer 303 distal to the base substrate 201, forming a gate electrode 402 on a side of the passivation layer 211 distal to the second buffer layer 303, forming an insulating layer 214 on a side of the gate electrode 402 and the passivation layer 211 distal to the second buffer layer 303, forming a via 215 extending through the insulating layer 214 and the passivation layer 211, forming a second electrode layer 213 on a side of the insulating layer 214 distal to the passivation layer 211, the second electrode layer 213 electrically connected to the drain electrode 400 through the via 215. Optionally, the first electrode layer 212 is a common electrode layer, and the second electrode layer 213 is a pixel electrode layer.

Accordingly, the display substrate in FIG. 8 includes a base substrate 201, a light shielding layer 302 on the base substrate 201, a second buffer layer 303 on a side of the light shielding layer 302 distal to the base substrate 201, and an active layer on a side of the second buffer layer 303 distal to the base substrate 201. The active layer includes a first doped region 2081, a second doped region 2082, a third doped region 2091, and a fourth doped region 2092. The first doped region 2081 has a higher dopant concentration than that of the second doped region 2082, and the third doped region 2091 has a higher dopant concentration that that of the fourth doped region 2092. The display substrate further includes a source electrode 300 and a drain electrode 400 on a side of the active layer distal to the second buffer layer 303, the source electrode 300 is in contact with the first doped region 2081 and the second doped region 2082, and the drain electrode 400 is in contact with the third doped region 2091 and the fourth doped region 2092. The display substrate further includes a first electrode layer 212 on a side of the second buffer layer 303 distal to the base substrate 201, a passivation layer 211 on a side of the thin film transistor and the second buffer layer 303 distal to the base substrate 201, a gate electrode 402 on a side of the passivation layer 211 distal to the second buffer layer 303, an insulating layer 214 on a side of the gate electrode 402 and the passivation layer 211 distal to the second buffer layer 303, a via 215 extending through the insulating layer 214 and the passivation layer 211, a second electrode layer 213 on a side of the insulating layer 214 distal to the passivation layer 211, the second electrode layer 213 electrically connected to the drain electrode 400 through the via 215. Optionally, the first electrode layer 212 is a common electrode layer, and the second electrode layer 213 is a pixel electrode layer.

Various appropriate insulating materials and various appropriate fabricating methods may be used to make the passivation layer. For example, an insulating material may be deposited on the substrate by a plasma-enhanced chemical vapor deposition (PECVD) process and patterned. Examples of appropriate insulating materials for making the passivation layer include, but are not limited to, silicon oxide ($SiO_x$), silicon nitride ($SiN_y$, e.g., $Si_3N_4$), silicon oxynitride ($SiO_xN_y$).

Various appropriate electrode materials and various appropriate fabricating methods may be used to make the pixel electrode. For example, an electrode material may be deposited on the substrate by vapor deposition (e.g., plasma-enhanced chemical vapor deposition), magnetron sputtering, or vacuum deposition. Examples of appropriate electrode materials for making the pixel electrode include, but are not limited to, transparent metal oxides such as indium tin oxide and indium zinc oxide.

In the display substrates of FIG. 7 and FIG. 8, the pixel electrode layer (e.g., the second electrode layer 213) is on a side of the passivation layer 211 distal to the common electrode layer (e.g., the first electrode layer 212). In some embodiments, the common electrode layer is on a side of the passivation layer 211 distal to the pixel electrode layer.

In another aspect, the present disclosure provides a thin film transistor having an active layer including a channel region, a source contact region, and a drain contact region. In some embodiments, the source contact region includes a first doped region and a second doped region between the first doped region and the channel region, the drain contact region includes a third doped region and a fourth doped region between the third doped region and the channel region, the first doped region has a higher dopant concentration than that of the second doped region, and the third doped region has a higher dopant concentration that that of the fourth doped region. Optionally, the second doped region includes a plurality of second doped sub-regions, a dopant concentration in the plurality of second doped sub-regions decreases along a direction from the first doped region to the channel region; and the fourth doped region includes a plurality of fourth doped sub-regions, a dopant concentration in the plurality of fourth doped sub-regions decreases along a direction from the third doped region to the channel region.

In another aspect, the present disclosure provides a thin film transistor fabricated by a method described herein. Optionally, the thin film transistor has a light doped region including a plurality of light doped sub-regions and optionally an un-doped sub-region. Optionally, the thin film transistor has a light doped source contact region including a plurality of light doped source contact sub-regions and optionally an un-doped source contact sub-region. Optionally, the thin film transistor has a light doped drain contact region including a plurality of light doped drain contact sub-regions and optionally an un-doped drain contact sub-region. Examples of such a thin film transistor are provided in FIG. 2J and FIG. 3I.

At least two methods may be used for making a thin film transistor of FIG. 2J or FIG. 3I. In both methods, a step-wise partial removal of the second photoresist layer followed with a step-wise doping process are performed. In a first method, the step-wise doping is performed in a newly exposed portion of the semiconductor layer only each time a partial removal of the second photoresist layer is conducted. In the second method, the step-wise doping is performed in all exposed portion of the semiconductor layer each time a partial removal of the second photoresist layer is conducted.

In a first example, the method includes forming a second photoresist layer by removing a portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is limited to the first portion of the semiconductor layer only. Optionally, the step of doping the first portion of the semiconductor layer is a light doping implantation process. Subsequent to doping the first portion of the semiconductor layer, the region of the semiconductor layer corresponding to the first doped region and the third doped region has a higher dopant concentration than that of the first portion of the semiconductor layer. Moreover, subsequent to doping the first portion of the semiconductor layer, the method further includes removing a first portion of the second photoresist layer to expose a first additional portion of the semiconductor layer corresponding to a first additional portion of the second doped region and a first additional portion of the fourth doped region; doping the first additional portion of the semiconductor layer using a first remaining second photoresist layer as a mask plate; removing a second portion of the second photoresist layer to expose a second additional portion of the semiconductor layer corresponding to a second additional portion of the second doped region and a second additional portion of the fourth doped region; doping the second additional portion of the semiconductor layer using a second remaining second photoresist layer as a mask plate; and removing a third portion of the second photoresist layer to expose a third additional portion of the semiconductor layer corresponding to a third additional portion of the second doped region and a third additional portion of the fourth doped region. Optionally, the process further includes doping the third additional portion of the semiconductor layer using a third remaining second photoresist layer as a mask plate. The first additional portion of the second doped region is between the channel region and the portion of the second doped region exposed when a portion of the first photoresist layer is removed, the first additional portion of the fourth doped region is between the channel region and the portion of the fourth doped region exposed when a portion of the first photoresist layer is removed. The second additional portion of the second doped region is between the channel region and the first additional portion of the second doped region, the second additional portion of the fourth doped region is between the channel region and the first additional portion of the fourth doped region. The third additional portion of the second doped region is between the channel region and the second additional portion of the second doped region, the third additional portion of the fourth doped region is between the channel region and the second additional portion of the fourth doped region. The first portion of the semiconductor layer has a higher dopant concentration than that of the first additional portion of the semiconductor layer. The first additional of the semiconductor layer has a higher dopant concentration than that of the second additional portion of the semiconductor layer. The second additional of the semiconductor layer has a higher dopant concentration than that of the third additional portion of the semiconductor layer. Optionally, the third additional portion of the semiconductor layer is un-doped.

In a second example, the method includes forming a second photoresist layer by removing a first portion of the first photoresist layer to expose a first portion of the semiconductor layer corresponding to at least a portion of the second doped region and at least a portion of the fourth doped region; and doping the first portion of the semiconductor layer using the second photoresist layer as a mask plate. Optionally, the step of doping the first portion of the semiconductor layer is performed by doping, in a same process, the region of the semiconductor layer corresponding to the first doped region and the third doped region, and the first portion of the semiconductor layer. Optionally, the doping process is a heavy doping implantation process. Subsequent to the doping process, the region of the semiconductor layer corresponding to the first doped region and the third doped region has a higher dopant concentration than that of the first portion of the semiconductor layer, because the region of the semiconductor layer corresponding to the first doped region and the third doped region have been doped twice whereas the first portion of the semiconductor layer has only been doped once so far, subsequent to doping the first portion of the semiconductor layer, the method further includes removing a first portion of the second photoresist layer to expose a first additional portion of the semiconductor layer corresponding to a first additional portion of the second doped region and a first additional of the fourth doped region; doping, in a same process, the region of the semiconductor layer corresponding to the first doped region and the third doped region, the first portion and the first additional portion of the semiconductor layer, removing a second portion of the second photoresist layer to expose a second additional portion of the semiconductor layer corresponding to a second additional portion of the second doped region and a second additional of the fourth doped region; doping, in a same process, the region of the semiconductor layer corresponding to the first doped region and the third doped region, the first portion of the semiconductor layer, and the first and second additional portions of the semiconductor layer, and removing a third portion of the second photoresist layer to expose a third additional portion of the semiconductor layer corresponding to a third additional portion of the second doped region and a third additional of the fourth doped region. Optionally, the process further includes doping, in a same process, the region of the semiconductor layer corresponding to the first doped region and the third doped region, the first portion of the semiconductor layer, and the first, second, and third additional portions of the semiconductor layer. The additional portion of the second doped region is between the channel region and the portion of the second doped region exposed when a portion of the first photoresist layer is removed, the additional portion of the fourth doped region is between the channel region and the portion of the fourth doped region exposed when a portion of the first photoresist layer is removed. The first portion of the semiconductor layer has a higher dopant concentration than that of the second portion of the semiconductor layer. A dopant concentration in the source contact region decreases along a direction from the first doped region to the channel region. A dopant concentration in the drain contact region decreases along a direction from the third doped region to the channel region. The first additional portion of the second doped region is between the channel region and the portion of the second doped region exposed when a portion of the first photoresist layer is removed, the first additional portion of the fourth doped region is between the channel region and the portion of the fourth doped region exposed when a portion of the first photoresist layer is removed. The second additional portion of the second doped region is between the channel region and the first additional portion of the second doped region, the second additional portion of the fourth doped region is between the channel region and the first additional portion of the fourth doped region. The third additional portion of the second doped region is between the channel region and the second additional portion of the second doped region, the third additional portion of the fourth doped region is between the channel region and the second additional portion of the fourth doped region. The first portion of the semiconductor layer has a higher dopant concentration than that of the first additional portion of the semiconductor layer. The first additional of the semiconductor layer has a higher dopant concentration than that of the second additional portion of the semiconductor layer. The second additional of the semiconductor layer has a higher dopant concentration than that of the third additional portion of the semiconductor layer. Optionally, the third additional portion of the semiconductor layer is un-doped.

In another aspect, the present disclosure provides a display substrate having a thin film transistor described herein or fabricated by a method described herein.

In another aspect, the present disclosure provides a display panel having a display substrate described herein.

In another aspect, the present disclosure provides a display apparatus having a display panel described herein. Optionally, the display apparatus is a liquid crystal display apparatus. Optionally, the display apparatus is an organic light emitting diode display apparatus. Examples of appropriate display apparatuses includes, but are not limited to, an electronic paper, a mobile phone, a tablet computer, a television, a monitor, a notebook computer, a digital album, a GPS, etc.

The present invention provides, inter alia, a thin film transistor, a display substrate and a display panel having the same, and a fabricating method thereof that substantially obviate one or more of the problems due to limitations and disadvantages of the related art. Several unique advantages may be achieved in the present method and apparatus. First, the fabricating process requires forming a photoresist material layer only once, leading to a simplified fabrication process, a shortened fabrication time, and lower manufacturing costs. Second, a highly accurate doping in the semiconductor layer can be achieved by performing a step-wise doping in the semiconductor layer using the ashed photoresist layer as a mask plate. Third, the method can be conveniently implemented for fabricating both a top gate-type thin film transistor and a bottom gate-type thin film transistor, making it suitable for various applications. Fourth, the present method obviates the issue of bright spot defects in the gate insulating layer observed in the conventional display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a thin film transistor comprising:
    forming an active layer having a channel region, a source contact region, and a drain contact region,
    wherein forming the source contact region comprises forming a first doped region and forming a second doped region between the first doped region and the channel region,
    forming the drain contact region comprises forming a third doped region and forming a fourth doped region between the third doped region and the channel region,
    the first doped region is formed to have a higher dopant concentration than that of the second doped region, and the third doped region is formed to have a higher dopant concentration that that of the fourth doped region;
    wherein forming the active layer comprises:
        forming a semiconductor layer having a pattern corresponding to that of the active layer on a base substrate;
        forming a first photoresist layer on a side of the semiconductor layer distal to the base substrate; the first photoresist layer being in an area corresponding to the channel region, the second doped region, and the fourth doped region;
        doping a region of the semiconductor layer corresponding to the first doped region and the third doped region using the first photoresist layer as a mask plate;
        forming a second photoresist layer by removing a portion of the first photoresist layer to expose an initial portion of the semiconductor layer corresponding to at least a portion of the second doped region and at least a portion of the fourth doped region; and
        doping the initial portion of the semiconductor layer using the second photoresist layer as a mask plate;
    wherein doping the region of the semiconductor layer corresponding to the first doped region and the third doped region and doping the initial portion of the semiconductor layer are performed by doping a dopant directly on the semiconductor layer without permeating the dopant through an insulating layer.

2. The method of claim 1, wherein doping the initial portion of the semiconductor layer is limited to only the second doped region and the fourth doped region, or portions thereof;
    subsequent to doping the initial portion of the semiconductor layer, the region of the semiconductor layer corresponding to the first doped region and the third doped region has a higher dopant concentration than that of the initial portion of the semiconductor layer.

3. The method of claim 1, subsequent to doping the initial portion of the semiconductor layer, further comprising performing following steps at least once:
    removing a portion of the second photoresist layer to expose an additional portion of the semiconductor layer corresponding to an additional portion of the second doped region and an additional portion of the fourth doped region; and
    doping the additional portion of the semiconductor layer using a remaining second photoresist layer as a mask plate;
    wherein the additional portion of the second doped region is between the portion of the second doped region and the channel region, the additional portion of the fourth doped region is between the portion of the fourth doped region and the channel region; and
    the initial portion of the semiconductor layer has a higher dopant concentration than that of the additional portion of the semiconductor layer.

4. The method of claim 3, wherein removing the portion of the second photoresist layer is performed by ashing.

5. The method of claim 1, wherein doping the initial portion of the semiconductor layer is performed by doping in a same process the region of the semiconductor layer corresponding to the first doped region and the third doped region, and the initial portion of the semiconductor layer; and
    the region of the semiconductor layer corresponding to the first doped region and the third doped region has a higher dopant concentration than that of the initial portion of the semiconductor layer.

6. The method of claim 1, subsequent to doping the initial portion of the semiconductor layer, further comprising performing following steps at least once:

removing a portion of the second photoresist layer to expose an additional portion of the semiconductor layer corresponding to an additional portion of the second doped region and an additional portion of the fourth doped region; and doping in a same process the region of the semiconductor layer corresponding to the first doped region and the third doped region, the initial portion of the semiconductor layer, and any additional portion of the semiconductor layer;

wherein the additional portion of the second doped region is between the portion of the second doped region and the channel region, the additional portion of the fourth doped region is between the portion of the fourth doped region and the channel region;

the initial portion of the semiconductor layer has a higher dopant concentration than that of the additional portion of the semiconductor layer;

a dopant concentration in the source contact region decreases along a direction from the first doped region to the channel region; and a dopant concentration in the drain contact region decreases along a direction from the third doped region to the channel region.

7. The method of claim 1, wherein forming the semiconductor layer comprises:

forming a semiconductor material layer on the base substrate;

forming a photoresist material layer on a side of the semiconductor material layer distal to the base substrate;

exposing the photoresist material layer with a mask plate, and developing an exposed photoresist material layer to obtain a photoresist pattern having a first section corresponding to the active layer, a second section outside of the first section, the photoresist material layer being removed in the second section thereby forming a third photoresist layer in the first section; and removing the semiconductor material layer in the second section thereby forming the semiconductor layer.

8. The method of claim 7, wherein the mask plate is a half-tone mask plate or a gray-tone mask plate, the first section comprises a first zone and a second zone;

the first zone corresponding to the channel region, the second doped region, and the fourth doped region; the second zone corresponding to the first doped region and the third doped region;

the first zone is substantially unexposed, the second zone is partially exposed, and the second section is fully exposed;

the third photoresist layer in the first zone has a thickness greater than that in the second zone.

9. The method of claim 8, wherein forming the first photoresist layer comprises ashing the third photoresist layer to remove the third photoresist layer in the second zone thereby exposing the region of the semiconductor layer corresponding to the first doped region and the third doped region;

wherein photoresist material in the first zone remains with a reduced thickness subsequent to ashing, thereby forming the first photoresist layer.

10. The method of claim 7, subsequent to forming the semiconductor material layer and prior to forming the photoresist material layer, further comprising:

doping the semiconductor material layer;

wherein the channel region is doped with a dopant subsequent to doping the semiconductor material layer.

11. The method of claim 1, wherein removing the portion of the first photoresist layer is performed by ashing.

12. The method of claim 1, wherein the dopant is one of phosphor and boron.

13. The method of claim 1, wherein the thin film transistor is a bottom gate-type thin film transistor, prior to forming the semiconductor layer, the method further comprising:

forming a gate electrode layer on the base substrate; and forming a buffer layer on a side of the gate electrode layer distal to the base substrate;

wherein the buffer layer is formed between the gate electrode layer and the semiconductor layer.

14. The method of claim 1, wherein the thin film transistor is a top gate-type thin film transistor, prior to forming the semiconductor layer, the method further comprising:

forming a light shielding layer on the base substrate; and forming a buffer layer on a side of the light shielding layer distal to the base substrate;

wherein the buffer layer is formed between the light shielding layer and the semiconductor layer.

15. A thin film transistor fabricated by a method of claim 1.

16. A display substrate, comprising a thin film transistor of claim 15.

17. A display panel, comprising a display substrate of claim 16.

18. A display apparatus, comprising a display panel of claim 17.

19. The method of claim 1, wherein the first photoresist layer is formed on the semiconductor layer without any intervening structure between the first photoresist layer and the semiconductor layer; and the second photoresist layer is formed on the semiconductor layer without any intervening structure between the second photoresist layer and the semiconductor layer.

20. The method of claim 1, further comprising forming a gate electrode material layer and patterning the gate electrode material layer to form a gate electrode layer; and forming a gate insulating material layer and patterning the gate insulating material layer to form a gate insulating layer;

wherein forming the gate electrode material layer and forming the gate insulating material layer are performed prior to forming the semiconductor layer having a pattern corresponding to that of the active layer or subsequent to doping the initial portion of the semiconductor layer.

* * * * *